US012802877B2

(12) United States Patent
Aoki

(10) Patent No.: US 12,802,877 B2
(45) Date of Patent: Nov. 17, 2026

(54) ELECTRONIC COMPONENT AND METHOD FOR MANUFACTURING ELECTRONIC COMPONENT

(71) Applicant: ROHM CO., LTD., Kyoto (JP)

(72) Inventor: Ryuya Aoki, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 66 days.

(21) Appl. No.: 18/781,390

(22) Filed: Jul. 23, 2024

(65) Prior Publication Data

US 2024/0379290 A1 Nov. 14, 2024

Related U.S. Application Data

(63) Continuation of application No. PCT/JP2022/047990, filed on Dec. 26, 2022.

(30) Foreign Application Priority Data

Jan. 28, 2022 (JP) ................................. 2022-012344

(51) Int. Cl.
*H01G 4/012* (2006.01)
*H01F 27/28* (2006.01)
(Continued)

(52) U.S. Cl.
CPC ............. *H01G 4/012* (2013.01); *H01F 27/28* (2013.01); *H01F 27/40* (2013.01); *H01F 41/02* (2013.01);
(Continued)

(58) Field of Classification Search
CPC ...... H03H 7/0115; H01G 4/012; H01G 4/228; H01G 4/40; H01F 17/0006;
(Continued)

(56) References Cited

U.S. PATENT DOCUMENTS 7,586,755 B2 * 9/2009 Satoh ..................... H10D 86/80 174/262
2004/0246692 A1 * 12/2004 Satoh ..................... H10D 86/80 257/E27.113
2008/0174976 A1 * 7/2008 Satoh ..................... H10D 86/80 257/E27.113

FOREIGN PATENT DOCUMENTS

JP 2011-044614 3/2011
JP 2017-092292 5/2017
JP 2020-205342 12/2020

OTHER PUBLICATIONS

International Search Report issued in International Application No. PCT/JP2022/047990, Mar. 20, 2023, 2 pages.

(Continued)

*Primary Examiner* — Fred Guillermety
(74) *Attorney, Agent, or Firm* — HSML P.C.

(57) ABSTRACT

An electronic component includes a functional portion, a first insulating layer, an external electrode, and a wiring portion. The first insulating layer includes a first obverse surface facing a first side in a thickness direction, and a first side surface facing a first side in a first direction intersecting the thickness direction. The external electrode is electrically connected to the functional portion. The wiring portion electrically connects the functional portion and the external electrode. The external electrode includes an obverse-surface covering portion covering the first obverse surface, and a side-surface covering portion covering the first side surface. The functional portion may include an inductor portion and a capacitor portion.

16 Claims, 21 Drawing Sheets

(51) Int. Cl.
*H01F 27/40* (2006.01)
*H01F 41/02* (2006.01)
*H01G 4/228* (2006.01)
*H01G 4/40* (2006.01)
*H03H 7/01* (2006.01)

(52) U.S. Cl.
CPC ............... *H01G 4/228* (2013.01); *H01G 4/40* (2013.01); *H03H 7/0115* (2013.01)

(58) Field of Classification Search
CPC .... H01F 17/0013; H01F 27/28; H01F 27/292; H01F 27/40; H01F 41/02
See application file for complete search history.

(56) References Cited

OTHER PUBLICATIONS

Written Opinion issued in International Application No. PCT/JP2022/047990, Mar. 20, 2023, 2 pages.
Notice of Reasons for Refusal issued in corresponding Japanese Patent Application No. 2023-576723, Sep. 1, 2026, 6 pages w/translation.

* cited by examiner

ELECTRONIC COMPONENT AND METHOD FOR MANUFACTURING ELECTRONIC COMPONENT

TECHNICAL FIELD

The present disclosure relates to an electronic component and a method for manufacturing the electronic component.

BACKGROUND ART

An electronic component including a functional portion, such as an inductor, a capacitor, and a transistor, has been conventionally known. For example, JP-A-2017-92292 discloses an LC composite device that includes an inductor and a capacitor as a functional portion. The LC composite device disclosed in JP-A-2017-92292 further includes a semiconductor substrate, a re-distribution layer, and a plurality of terminals. The re-distribution layer is formed on the semiconductor substrate. The re-distribution layer is formed with the inductor and the capacitor. The terminals are arranged on the upper surface (the surface on the opposite side from the semiconductor substrate) of the re-distribution layer. Each of the terminals is electrically connected to the inductor or the capacitor via an interlayer connecting conductor formed on the re-distribution layer.

DETAILED DESCRIPTION OF EMBODIMENTS

Figure 1:
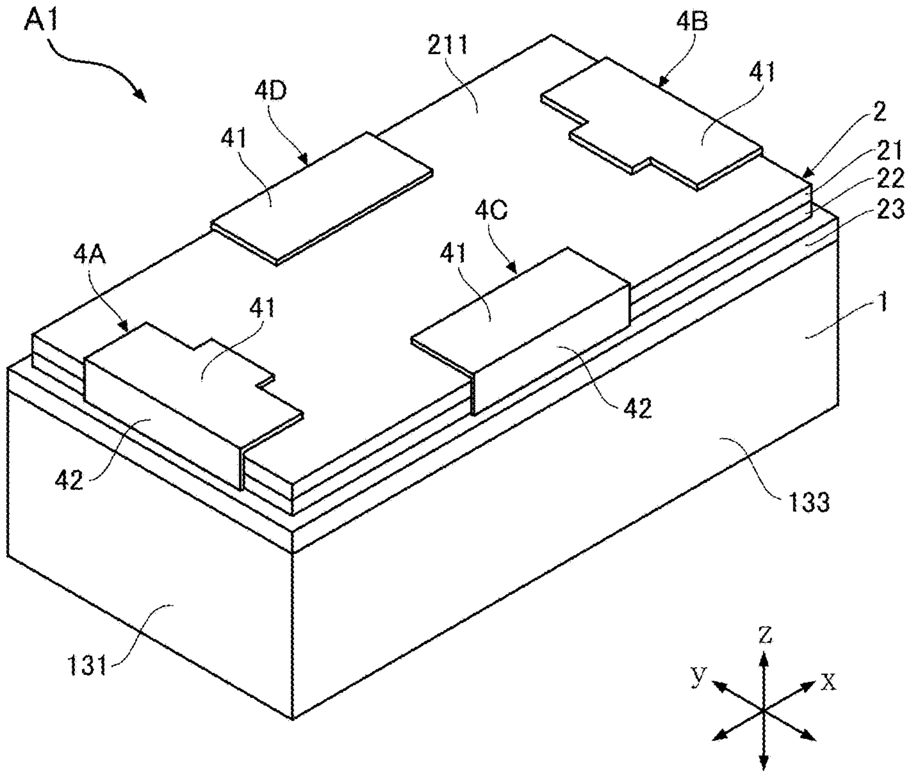
FIG. 1 is a perspective view showing an electronic component according to a first embodiment.
Figure 2:
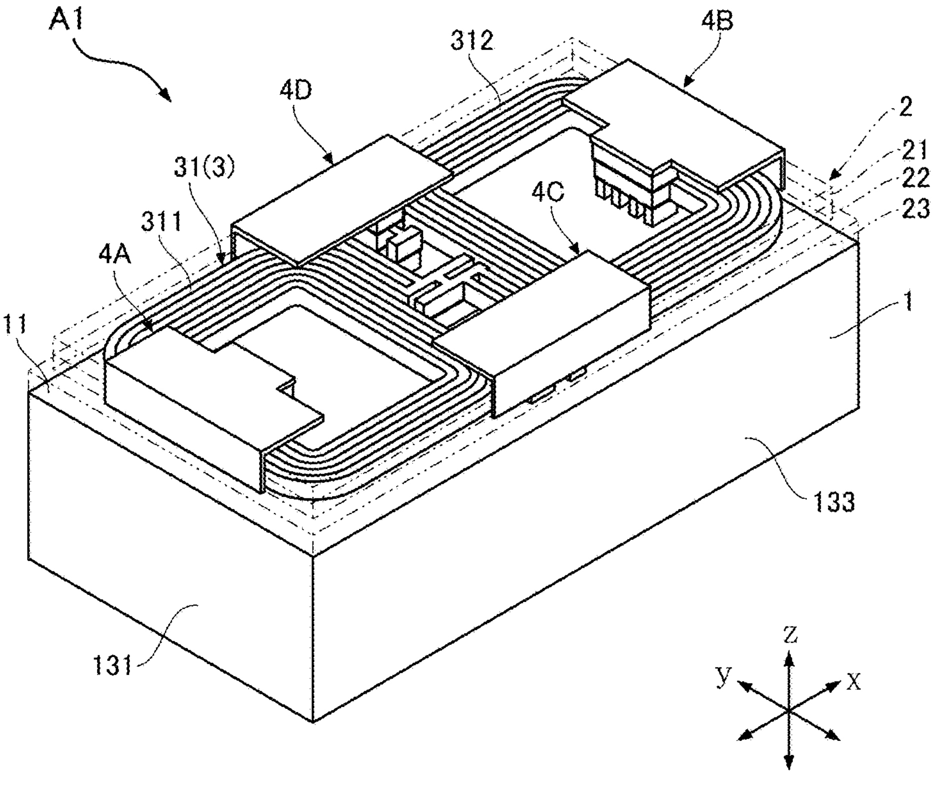
FIG. 2 corresponds to the perspective view of FIG. 1, with a sealing member shown transparent.
Figure 3:
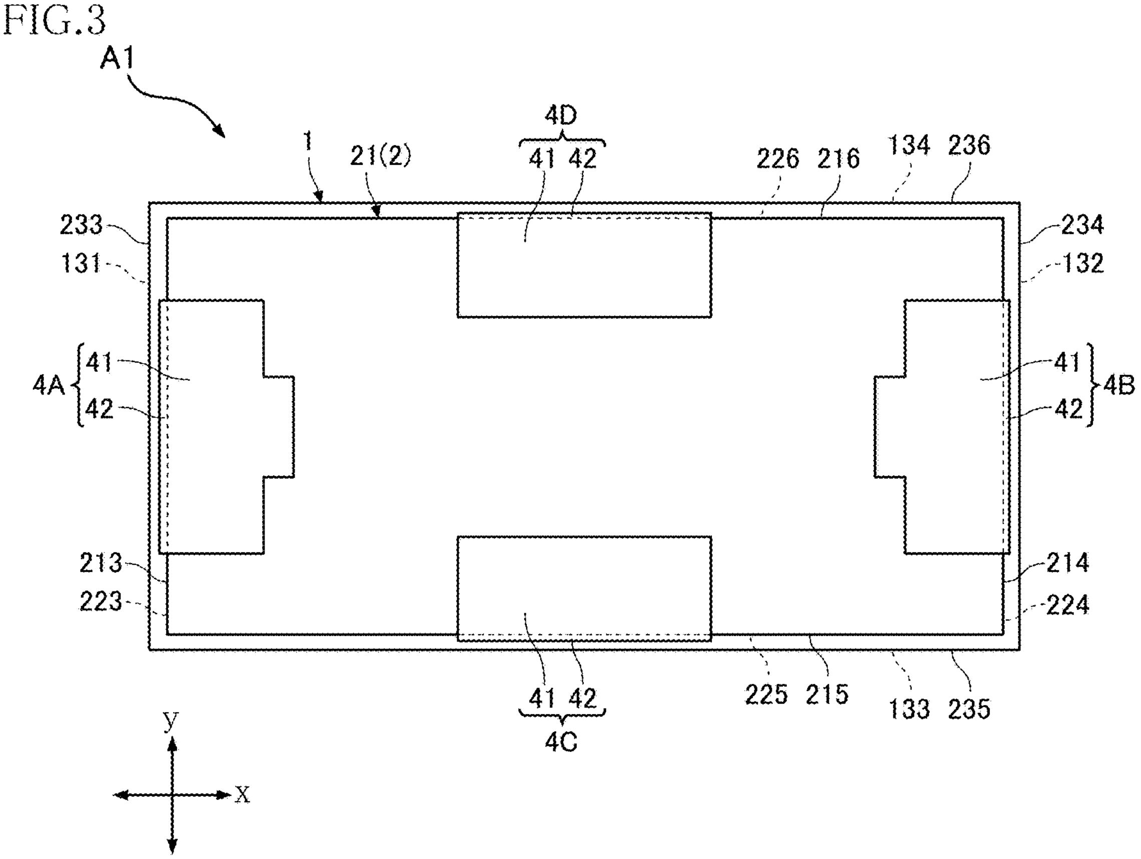
FIG. 3 is a plan view showing the electronic component according to the first embodiment.
Figure 4:
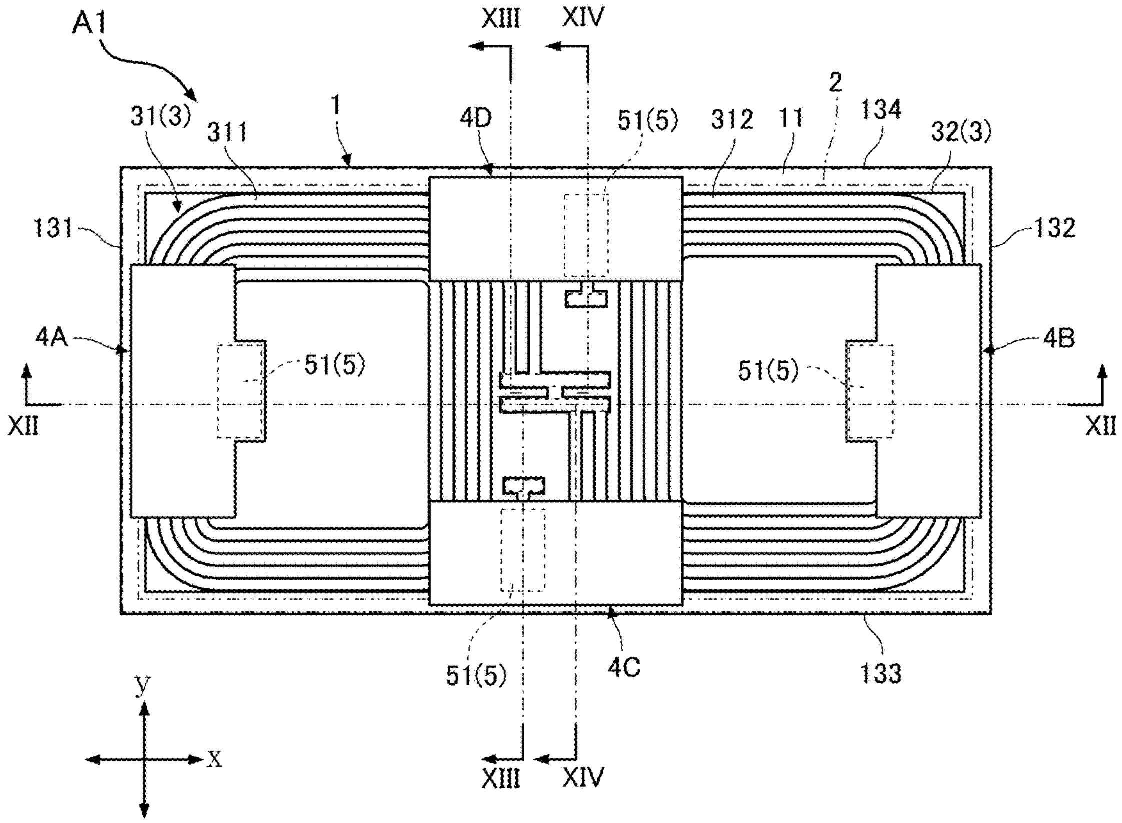
FIG. 4 corresponds to the plan view of FIG. 3, with the sealing member shown transparent.
Figure 5:
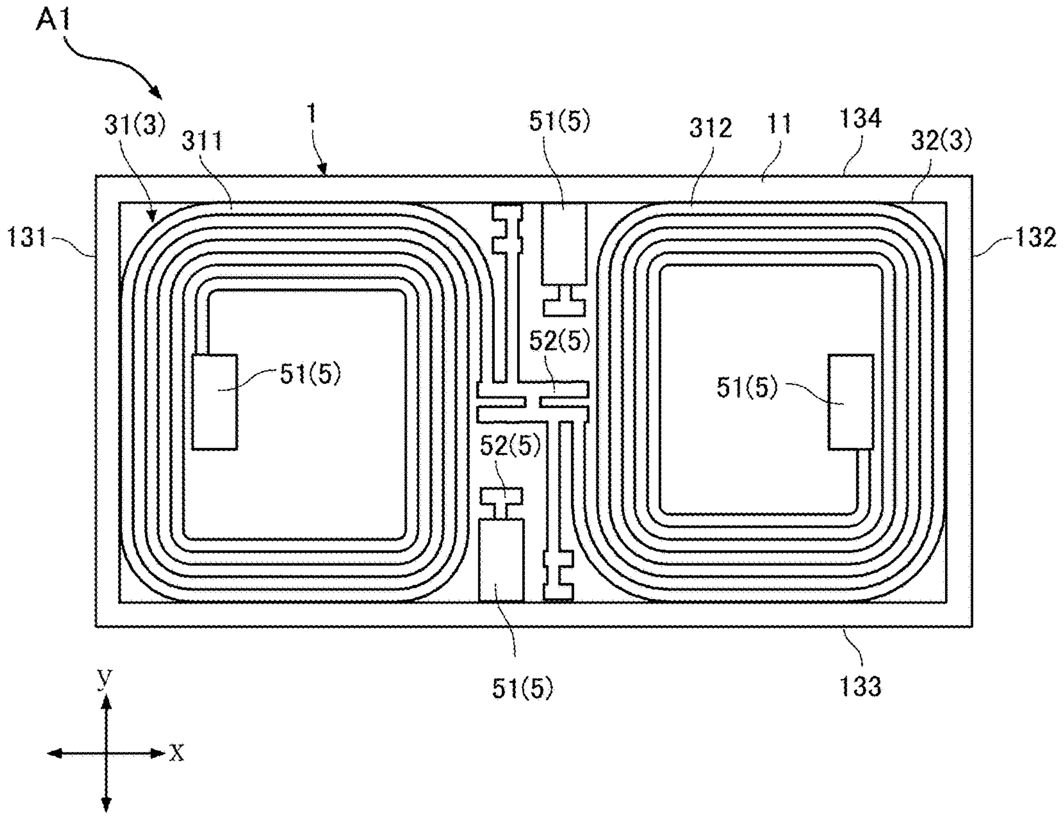
FIG. 5 corresponds to the plan view of FIG. 4, from which the sealing member and external electrodes are omitted.

The following describes preferred embodiments of an electronic component according to the present disclosure, with reference to the drawings. In the following description, identical or similar elements are provided with the same reference numerals, and redundant descriptions are omitted. The terms such as "first", "second" and "third" in the present disclosure are used merely as labels, and are not intended to impose orders on the elements accompanied with these terms.

In the present disclosure, the phrases "an object A is formed in an object B" and "an object A is formed on an object B" include, unless otherwise specified, "an object A is formed directly in/on an object B" and "an object A is formed in/on an object B with another object interposed between the object A and the object B". Similarly, the phrases "an object A is disposed in an object B" and "an object A is disposed on an object B" include, unless otherwise specified, "an object A is disposed directly in/on an object B" and "an object A is disposed in/on an object B with another object interposed between the object A and the object B". Similarly, the phrase "an object A is located on an object B" includes, unless otherwise specified, "an object A is located on an object B in contact with the object B" and "an object A is located on an object B with another object interposed between the object A and the object B". Further, the phrase "an object A overlaps with an object B as viewed in a certain direction" includes, unless otherwise specified, "an object A overlaps with the entirety of an object B" and "an object A overlaps with a portion of an object B". Further, the phrase "an object A (or the constituent material thereof) contains a material C" includes "an object A (or the constituent material thereof) is made of a material C" and "an object A (or the constituent material thereof) is mainly composed of a material C".

First Embodiment

FIGS. 1 to 14 show an electronic component A1 according to a first embodiment. The electronic component A1 includes an insulating substrate 1, a sealing member 2, a functional portion 3, a plurality of external electrodes 4A to 4D, and a wiring portion 5.

For convenience of description, the thickness direction of the electronic component A1 is referred to as "thickness direction z". In the description below, one side in the thickness direction z may be referred to as "upper side", and the other side as "lower side". Note that the terms such as "top", "bottom", "upward", "downward", "upper surface", and "lower surface" are used to indicate the relative positions of elements or the like in the thickness direction z and do not necessarily define the relationship with respect to the direction of gravity. Also, "plan view" refers to the view seen in the thickness direction z. A direction intersecting the thickness direction z is referred to as "first direction x". In the present disclosure, the first direction x is perpendicular to the thickness direction z. The first direction x is the horizontal direction in the plan view (see FIGS. 2 to 7) of the electronic component A1. The direction intersecting the thickness direction z and the first direction x is referred to as "second direction y". In the present disclosure, the second direction y is perpendicular to the thickness direction z and the first direction x. The second direction y is the vertical direction in the plan view (see FIGS. 2 to 7) of the electronic component A1.

The insulating substrate 1 supports the sealing member 2 and the functional portion 3. The insulating substrate 1 is a semiconductor substrate, for example. The constituent material of the semiconductor substrate contains silicon (Si), for example. The insulating substrate 1 may be a glass substrate or a ceramic substrate instead of a semiconductor substrate.

The insulating substrate 1 has a substrate obverse surface 11, a substrate reverse surface 12, and a plurality of substrate side surfaces 131 to 134. As shown in FIGS. 8 to 14, the substrate obverse surface 11 and the substrate reverse surface 12 are spaced apart from each other in the thickness direction z. The substrate obverse surface 11 faces upward in the thickness direction z, and the substrate reverse surface 12 faces downward in the thickness direction z. The substrate side surfaces 131 to 134 are located between the substrate obverse surface 11 and the substrate reverse surface 12 in the thickness direction z. As shown in FIGS. 3 to 9 and 12, the pair of substrate side surfaces 131 and 132 are spaced apart from each other in the first direction x, and face away from each other in the first direction x. As shown in FIGS. 3 to 7, 10, 11, 13, and 14, the pair of substrate side surfaces 133 and 134 are spaced apart from each other in the second direction y, and face away from each other in the second direction y.

The sealing member 2 is arranged on the substrate obverse surface 11 of the insulating substrate 1. The sealing member 2 covers the functional portion 3. As shown in FIGS. 1, 2, and 8 to 14, the sealing member 2 includes a first insulating layer 21, a second insulating layer 22, and a third insulating layer 23.

The first insulating layer 21, the second insulating layer 22, and the third insulating layer 23 are stacked in the thickness direction z. The constituent material of each of the first insulating layer 21, the second insulating layer 22, and the third insulating layer 23 includes a photosensitive resin, for example. Each of the first insulating layer 21, the second insulating layer 22, and the third insulating layer 23 may be formed of a dry film resist.

The first insulating layer 21 is formed on the second insulating layer 22 in the thickness direction z. As shown in FIGS. 8 to 14, the first insulating layer 21 has a first obverse surface 211, a first reverse surface 212, and a plurality of first side surfaces 213 to 216. The first obverse surface 211 and the first reverse surface 212 are spaced apart from each other in the thickness direction z. The first obverse surface 211 faces upward in the thickness direction z, and the first reverse surface 212 faces downward in the thickness direction z. The first side surfaces 213 to 216 are flanked by the first obverse surface 211 and the first reverse surface 212 in the thickness direction z. The pair of first side surfaces 213 and 214 are spaced apart from each other in the first direction x, and face away from each other in the first direction x. The pair of first side surfaces 215 and 216 are spaced apart from each other in the second direction y, and face away from each other in the second direction y.

The second insulating layer 22 is formed on the third insulating layer 23 in the thickness direction z. As shown in FIGS. 8 to 14, the second insulating layer 22 has a second obverse surface 221, a second reverse surface 222, and a plurality of second side surfaces 223 to 226. The second obverse surface 221 and the second reverse surface 222 are spaced apart from each other in the thickness direction z. The second obverse surface 221 faces upward in the thickness direction z, and the second reverse surface 222 faces downward in the thickness direction z. The second obverse surface 221 is in contact with the first reverse surface 212. The first insulating layer 21 is stacked on the second obverse surface 221. The second side surfaces 223 to 226 are flanked by the second obverse surface 221 and the second reverse surface 222 in the thickness direction z. The pair of second side surfaces 223 and 224 are spaced apart from each other in the first direction x, and face away from each other in the first direction x. The pair of second side surfaces 225 and 226 are spaced apart from each other in the second direction y, and face away from each other in the second direction y. The second side surfaces 223 to 226 are flush with the first side surfaces 213 to 216, respectively.

The third insulating layer 23 is stacked on the substrate obverse surface 11. As shown in FIGS. 8 to 14, the third insulating layer 23 has a third obverse surface 231, a third reverse surface 232, and a plurality of third side surfaces 233 to 236. The third obverse surface 231 and the third reverse surface 232 are spaced apart from each other in the thickness direction z. The third obverse surface 231 faces upward in the thickness direction z, and the third reverse surface 232 faces downward in the thickness direction z. The third obverse surface 231 is in contact with the second reverse surface 222. The second insulating layer 22 is stacked on the third obverse surface 231. The third side surfaces 233 to 236 are flanked by the third obverse surface 231 and the third reverse surface 232 in the thickness direction z. The pair of third side surfaces 233 and 234 are spaced apart from each other in the first direction x, and face away from each other in the first direction x. The pair of third side surfaces 235 and

236 are spaced apart from each other in the second direction y, and face away from each other in the second direction y. As shown in FIGS. 8 to 14, the third side surfaces 233 to 236 are flush with the substrate side surfaces 131 to 134, respectively. In plan view, the third side surfaces 233 to 236 are located outside the respective second side surfaces 223 to 226. Thus, in plan view, the third insulating layer 23 protrudes from the first insulating layer 21 and the second insulating layer 22 toward both sides in the first direction x and both sides in the second direction y. Unlike this configuration, the third side surfaces 233 to 236 may be flush with the second side surfaces 223 to 226, respectively.

The functional portion 3 is the core of electrical functions in the electronic component A1. The functional portion 3 includes an inductor portion 31 and a capacitor portion 32. The inductor portion 31 and the capacitor portion 32 are electrically connected to form an LC filter, for example. The LC filter may be any one of a low-pass filter, a high-pass filter, and a band-pass filter (band-stop filter). The functional portion 3 is not limited to the LC filter configured with the inductor portion 31 and the capacitor portion 32. For example, the inductor portion 31 and the capacitor portion 32 may form a balanced-unbalanced conversion circuit called "balun". Further, the inductor portion 31 and the capacitor portion 32 may not be electrically connected to each other in the electronic component A1.

The inductor portion 31 is formed in the second insulating layer 22. The inductor portion 31 includes two winding portions 311 and 312. Note that the inductor portion 31 is not limited to the example of including the two winding portions 311 and 312, and may include a single winding portion or may include three or more winding portions. The constituent material of the winding portions 311 and 312 contains a conductive material. The conductive material may be, but not limited to, copper or a copper alloy. The current that flows through each of the winding portions 311 and 312 provides inductance. Each of the two winding portions 311 and 312 is planarly wound in the second insulating layer 22. The number of turns of each of the two winding portions 311 and 312 is not limited to the illustrated example. The two winding portions 311 and 312 are aligned in the first direction x and electrically connected to each other via the wiring portion 5. The inductor portion 31 is not limited to being formed in the second insulating layer 22, and may be formed over two insulating layers adjacent to each other in the thickness direction z among the first insulating layer 21, the second insulating layer 22, and the third insulating layer 23.

The capacitor portion 32 is formed between the insulating substrate 1 and the third insulating layer 23, and is flanked by them in the thickness direction z. The capacitor portion 32 has a metal-insulator-metal (MIM) structure, for example. In the capacitor portion 32 according to the present embodiment, a metal layer, an insulator, and a metal layer are stacked in this order in the thickness direction z, and at least one capacitor is formed by the shape (arrangement pattern) of the two metal layers. This creates capacitance. In the example shown in FIG. 7, the capacitor portion 32 has a rectangular shape in plan view. However, the capacitor portion 32 may be divided into a plurality of areas. The configuration of the capacitor portion 32 may be changed appropriately according to the type of a desired filter.

The external electrodes 4A to 4D are electrically connected to the functional portion 3 (both or one of the inductor portion 31 and the capacitor portion 32). The external electrode 4A is electrically connected to one of the two winding portions 311 in the inductor portion 31. The external electrode 4B is electrically connected to one of the two winding portions 311 in the inductor portion 31. Each of the external electrodes 4A and 4B is electrically connected to the capacitor portion 32. Each of the two external electrodes 4C and 4D is electrically connected to the capacitor portion 32. The constituent material of each of the external electrodes 4A to 4D contains a conductive material. The conductive material may be, but not limited to, copper or a copper alloy.

As shown in FIGS. 3 and 12 to 14, each of the external electrodes 4A to 4D includes an obverse-surface covering portion 41 and a side-surface covering portion 42. Unless otherwise specified, the following description of an obverse-surface covering portion 41 and a side-surface covering portion 42 applies to each of the external electrodes 4A to 4D.

An obverse-surface covering portion 41 is formed on the first obverse surface 211, and covers a portion of the first obverse surface 211. A side-surface covering portion 42 extends from the obverse-surface covering portion 41 to the lower side in the thickness direction z. The side-surface covering portion 42 of the external electrode 4A extends from the first side surface 213 to the second side surface 223, and covers a portion of the first side surface 213 and a portion of the second side surface 223. The side-surface covering portion 42 of the external electrode 4B extends from the first side surface 214 to the second side surface 224, and covers a portion of the first side surface 214 and a portion of the second side surface 224. The side-surface covering portion 42 of the external electrode 4C extends from the first side surface 215 to the second side surface 225, and covers a portion of the first side surface 215 and a portion of the second side surface 225. The side-surface covering portion 42 of the external electrode 4D extends from the first side surface 216 to the second side surface 226, and covers a portion of the first side surface 216 and a portion of the second side surface 226.

In each of the external electrodes 4A to 4D, both or one of the surface (exposed surface) of the obverse-surface covering portion 41 and the surface (exposed surface) of the side-surface covering portion 42 is plated. The plating may have a multilayer structure in which a nickel layer, a palladium layer, and a gold layer are stacked in this order or in which a nickel layer and a gold layer are stacked in this order (from the surface of each of the obverse-surface covering portion 41 and the side-surface covering portion 42). Alternatively, the plating may have a single layer structure with, for example, a nickel layer or a gold layer. It is possible to omit the plating treatment.

The wiring portion 5 connects electrically the functional portion 3 and the external electrodes 4A to 4D. The constituent material of the wiring portion 5 contains a conductive material. The conductive material may be, but not limited to, copper or a copper alloy. The wiring portion 5 includes a first wiring portion 51, a second wiring portion 52, and a third wiring portion 53.

The first wiring portion 51 penetrates through the first insulating layer 21 in the thickness direction z, and is covered with the first insulating layer 21. The second wiring portion 52 penetrates through the second insulating layer 22 in the thickness direction z, and is covered with the second insulating layer 22. The third wiring portion 53 penetrates through the third insulating layer 23 in the thickness direction z, and is covered with the third insulating layer 23. In the example shown in FIG. 12, the portions where the first wiring portion 51, the second wiring portion 52, and the third wiring portion 53 overlap with each other in plan view decrease in size in the order of the first wiring portion 51, the second wiring portion 52, and the third wiring portion 53. Thus, the contact between the first wiring portion 51 and the second wiring portion 52 and the contact between the second wiring portion 52 and the third wiring portion 53 can be more reliable even if an arrangement error of the first wiring portion 51, the second wiring portion 52, and the third wiring portion 53 occurs in the manufacturing thereof. Alternatively, the portions where the first wiring portion 51, the second wiring portion 52, and the third wiring portion 53 overlap with each other in plan view may have the same size or decrease in size in the order of the third wiring portion 53, the second wiring portion 52, and the first wiring portion 51.

Figure 6:
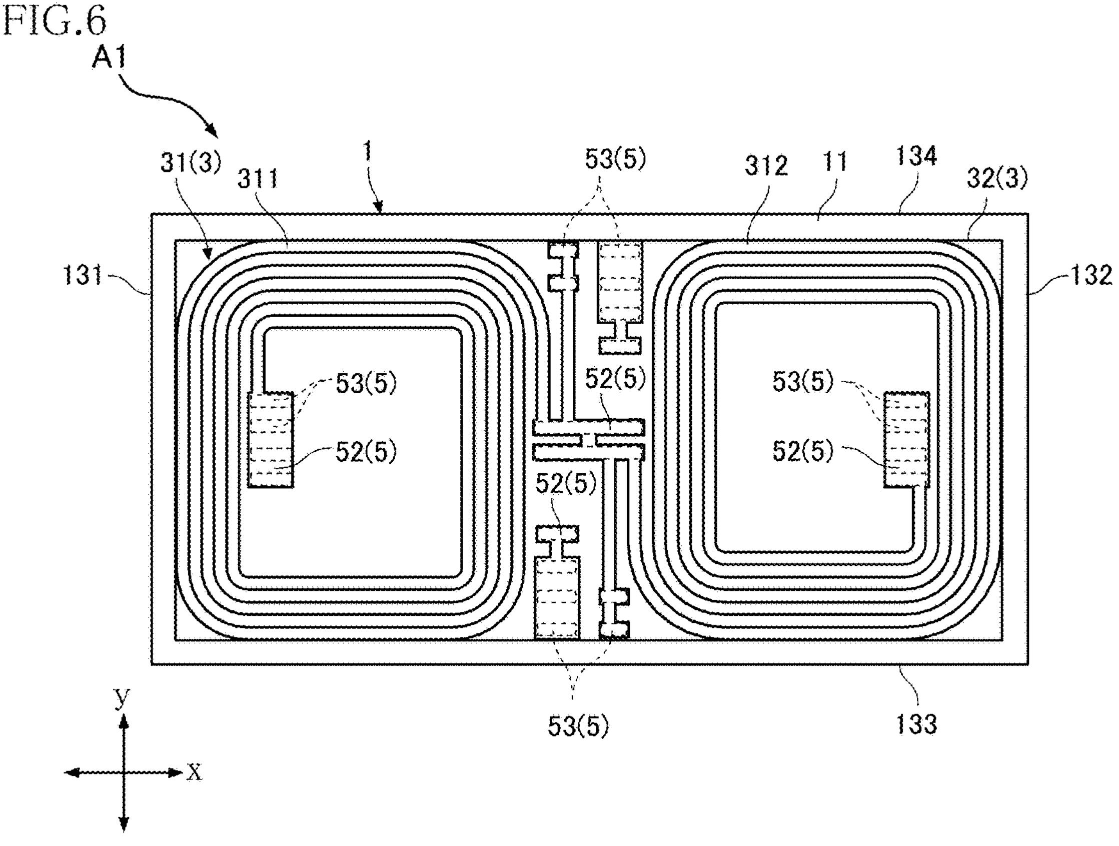
FIG. 6 corresponds to the plan view of FIG. 5, from which a portion (a first wiring portion) of a wiring portion is omitted.
Figure 7:
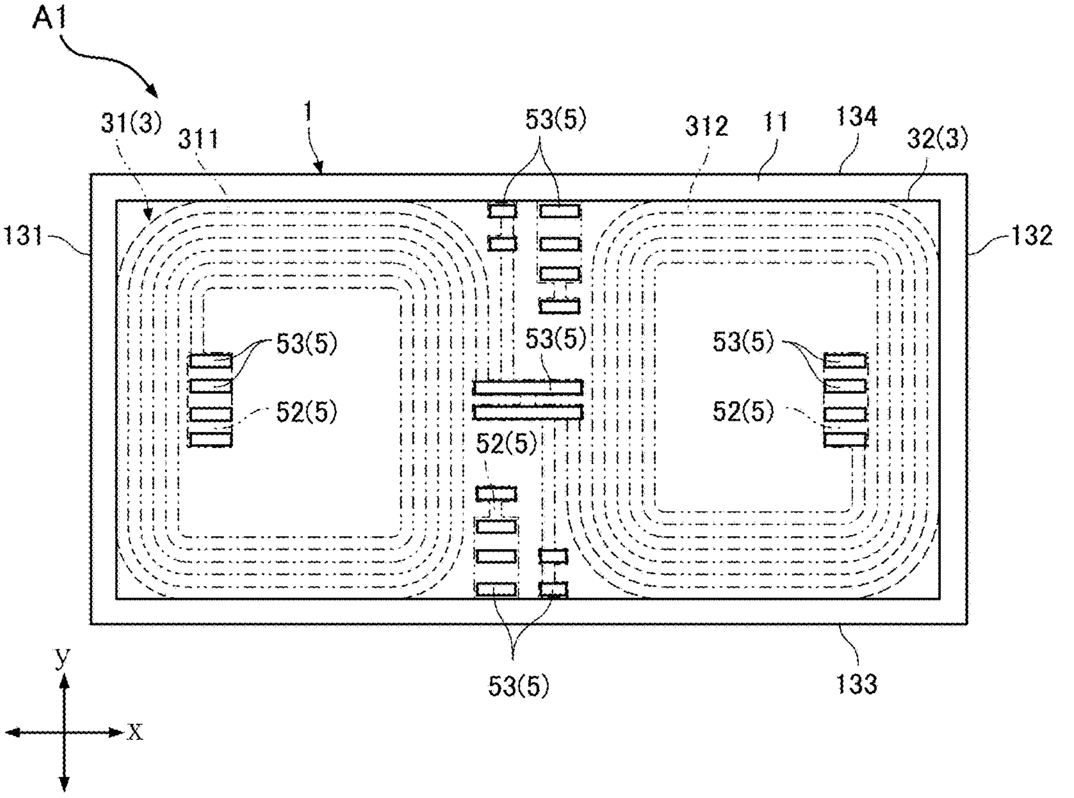
FIG. 7 corresponds to the plan view of FIG. 6, with a portion (an inductor portion) of the functional portion and a portion (a second wiring portion) of the wiring portion shown transparent.
Figure 8:
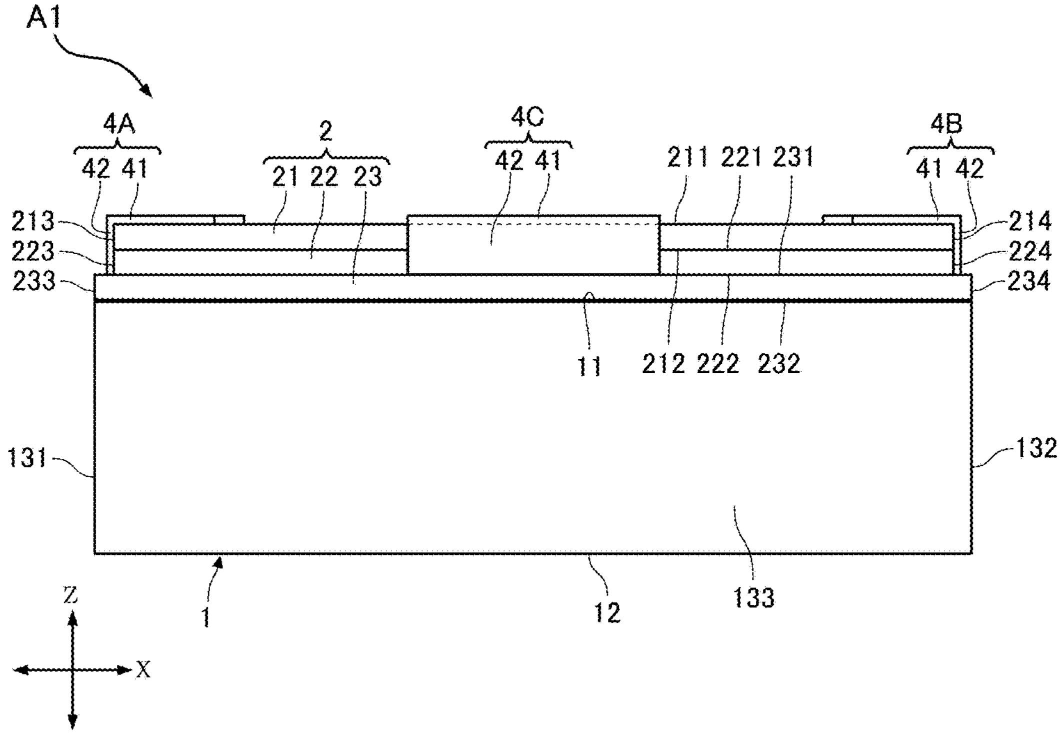
FIG. 8 is a front view showing the electronic component according to the first embodiment.
Figure 9:
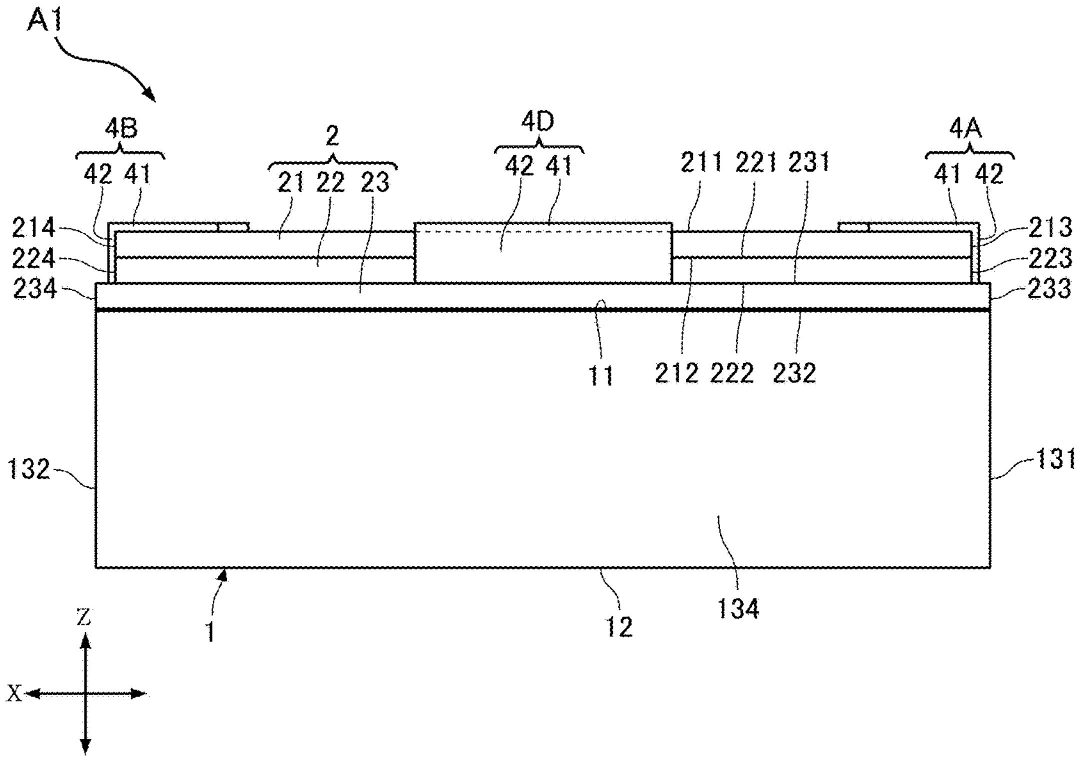
FIG. 9 is a rear view showing the electronic component according to the first embodiment.
Figure 10:
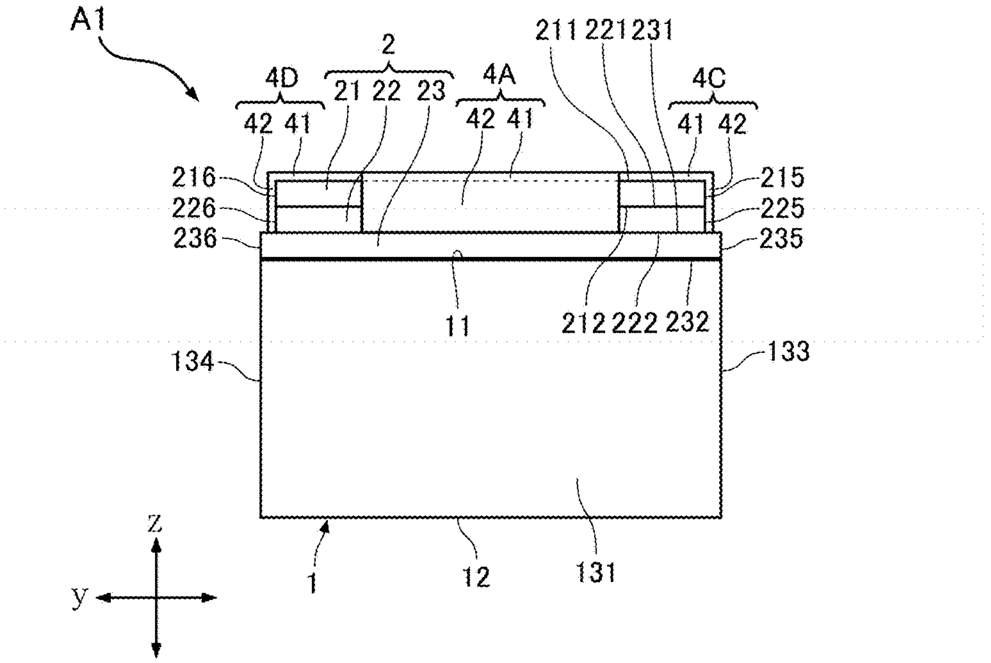
FIG. 10 is a left-side view showing the electronic component according to the first embodiment.
Figure 11:
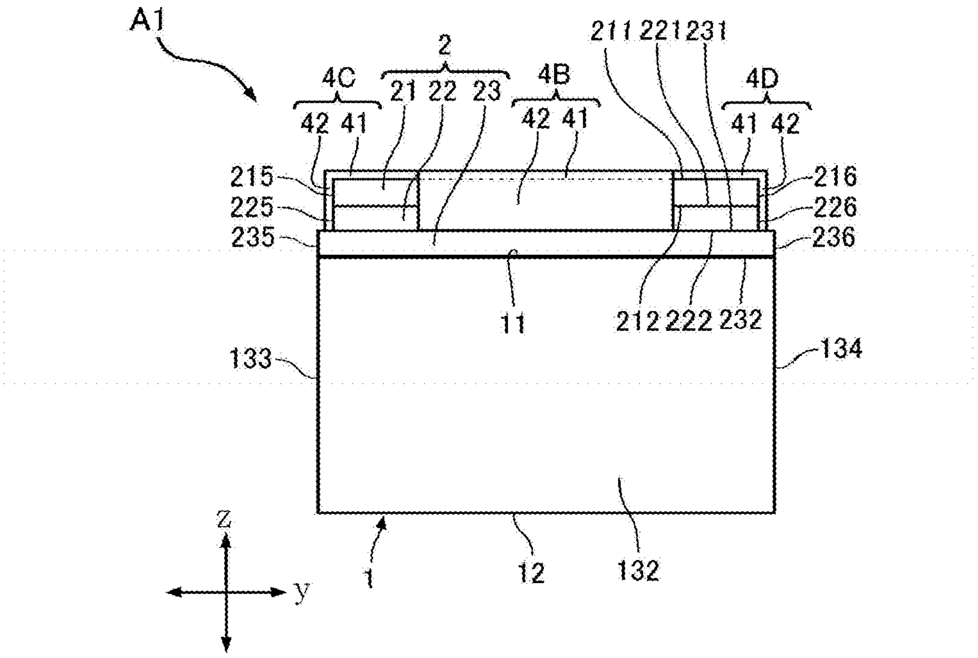
FIG. 11 is a right-side view showing the electronic component according to the first embodiment.
Figure 12:
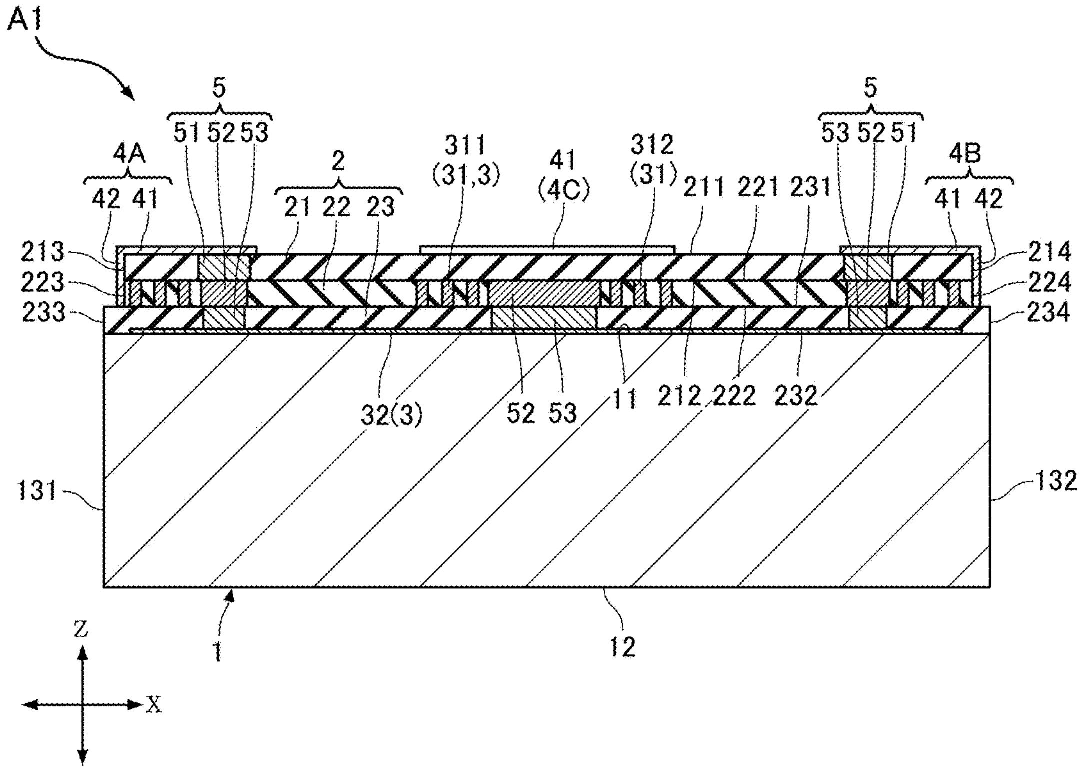
FIG. 12 is a cross-sectional view along line XII-XII in FIG. 4.
Figure 13:
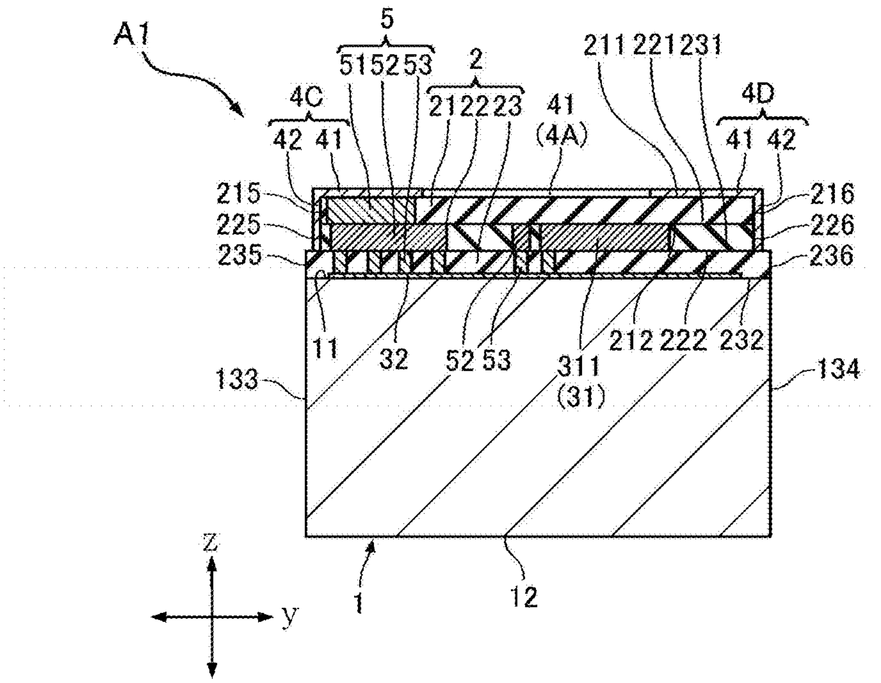
FIG. 13 is a cross-sectional view along line XIII-XIII in FIG. 4.
Figure 14:
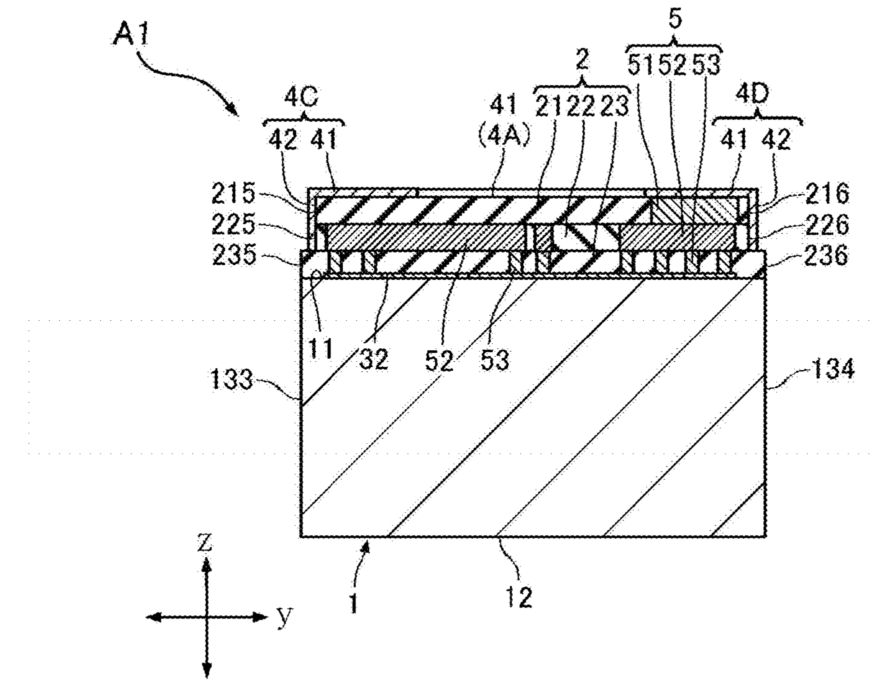
FIG. 14 is a cross-sectional view along line XIV-XIV in FIG. 4.

In the illustrated example, each of the external electrodes 4A to 4D is electrically connected to the functional portion 3 (both or one of the inductor portion 31 and the capacitor portion 32) as follows. As shown in FIGS. 4 to 7 and 12, the external electrode 4A is electrically connected to the winding portion 311 (the inductor portion 31) via the first wiring portion 51 and the second wiring portion 52, and is electrically connected to the capacitor portion 32 via the first wiring portion 51, the second wiring portion 52, and the third wiring portion 53. As shown in FIGS. 4 to 7 and 12, the external electrode 4B is electrically connected to the winding portion 312 (the inductor portion 31) via the first wiring portion 51 and the second wiring portion 52, and is electrically connected to the capacitor portion 32 via the first wiring portion 51, the second wiring portion 52, and the third wiring portion 53. As shown in FIG. 6, the two winding portions 311 and 312 are electrically connected to each other via the second wiring portion 52. As shown in FIG. 13, the external electrode 4C is electrically connected to the capacitor portion 32 via the first wiring portion 51, the second wiring portion 52, and the third wiring portion 53. As shown in FIG. 14, the external electrode 4D is electrically connected to the capacitor portion 32 via the first wiring portion 51, the second wiring portion 52, and the third wiring portion 53.

Next, a method for manufacturing the electronic component A1 will be described with reference to FIGS. 15 to 23. FIGS. 15 to 23 are cross-sectional views each showing a step of the method for manufacturing the electronic component A1, and correspond to the cross section of the electronic component A1 in FIG. 12. For example, the manufacturing method of the electronic component A1 includes a substrate preparation step, a capacitor portion formation step, a primary insulating layer formation step, a primary wiring portion formation a step, secondary insulating layer formation step, a secondary wiring portion formation step, a tertiary insulating layer formation step, a resist formation step, a tertiary wiring portion formation step, an external electrode formation step, and a dicing step.

Figure 15:
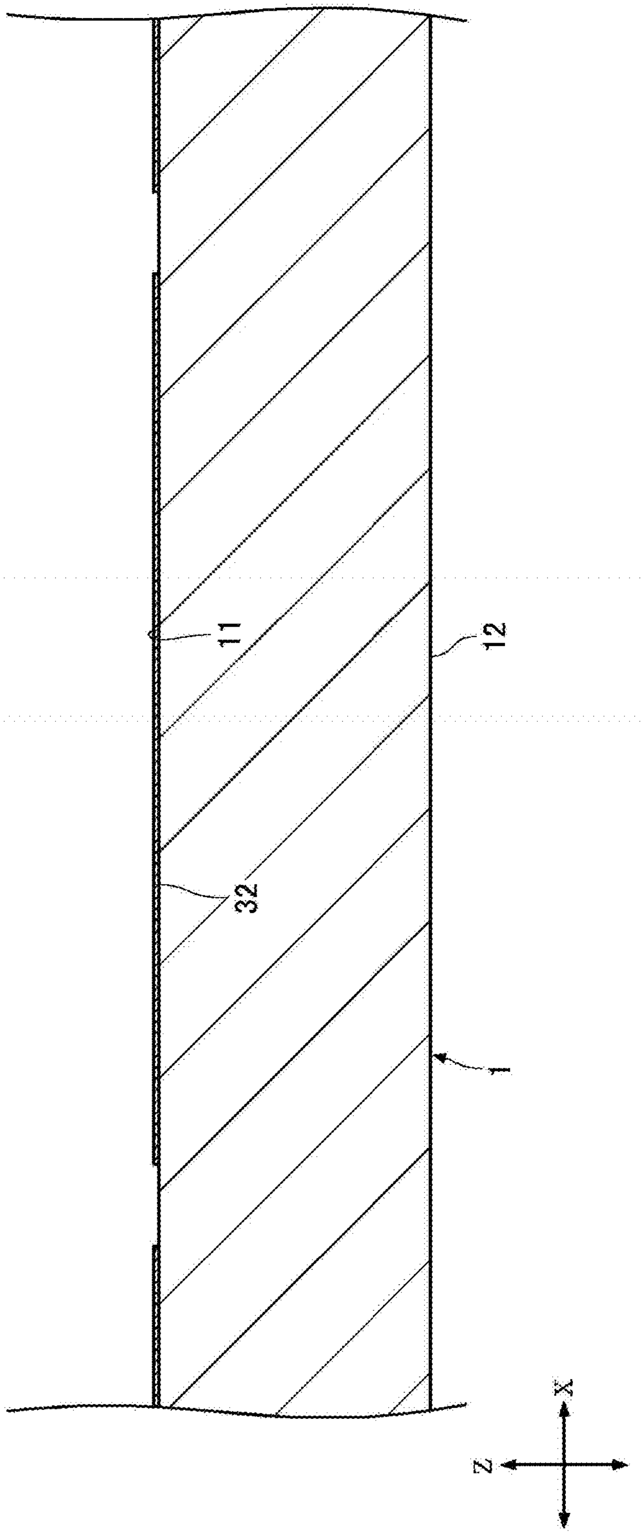
FIG. 15 is a cross-sectional view showing a step of the method for manufacturing the electronic component according to the first embodiment.

Substrate Preparation Step and Capacitor Portion Formation Step:

First, as shown in FIG. 15, an insulating substrate 1 is prepared, and a capacitor portion 32 of a functional portion 3 is formed on the insulating substrate 1. The insulating substrate 1 to be prepared is a semiconductor substrate, for example. In the present embodiment, the semiconductor substrate is a Si wafer. Note that the insulating substrate 1 to be prepared may be a glass substrate or a ceramic substrate instead of a semiconductor substrate. The capacitor portion 32 to be formed has an MIM structure, for example.

Figure 16:
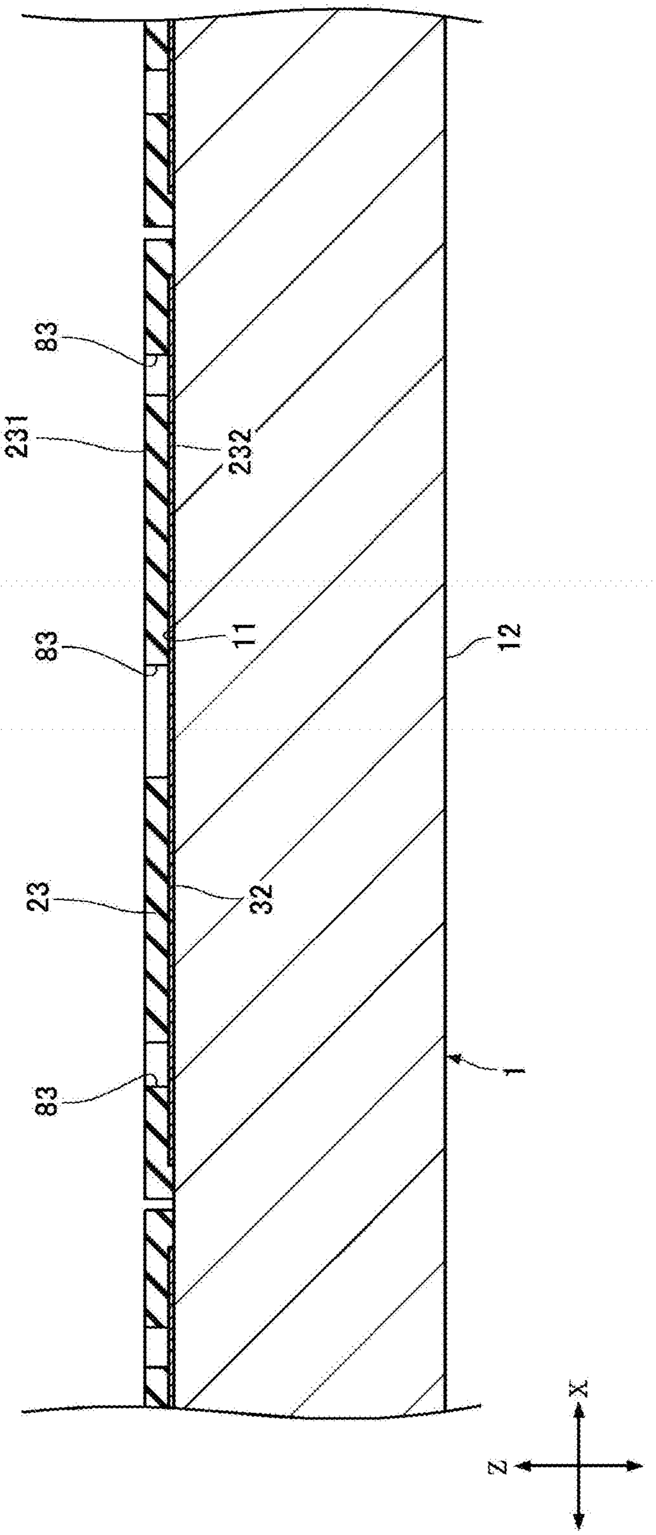
FIG. 16 is a cross-sectional view showing a step of the method for manufacturing the electronic component according to the first embodiment.

Primary Insulating Layer Formation Step:

Next, as shown in FIG. 16, a third insulating layer 23 is formed. The primary insulating layer formation step is a third insulating layer formation step in which the third insulating layer 23 is formed. In this step, first, a dry film resist is attached to the surface (a substrate obverse surface 11)) of the insulating substrate 1 on which the capacitor portion 32 is formed. The dry film resist contains an epoxy resin as a photosensitive resin. The dry film resist is then patterned through exposure and development. As a result, a third insulating layer 23 having a pattern 83 is formed as shown in FIG. 16. The pattern 83 thus formed penetrates through the third insulating layer 23 in the thickness direction z. The pattern 83 corresponds to the area in which a third wiring portion 53 is arranged.

Figure 17:
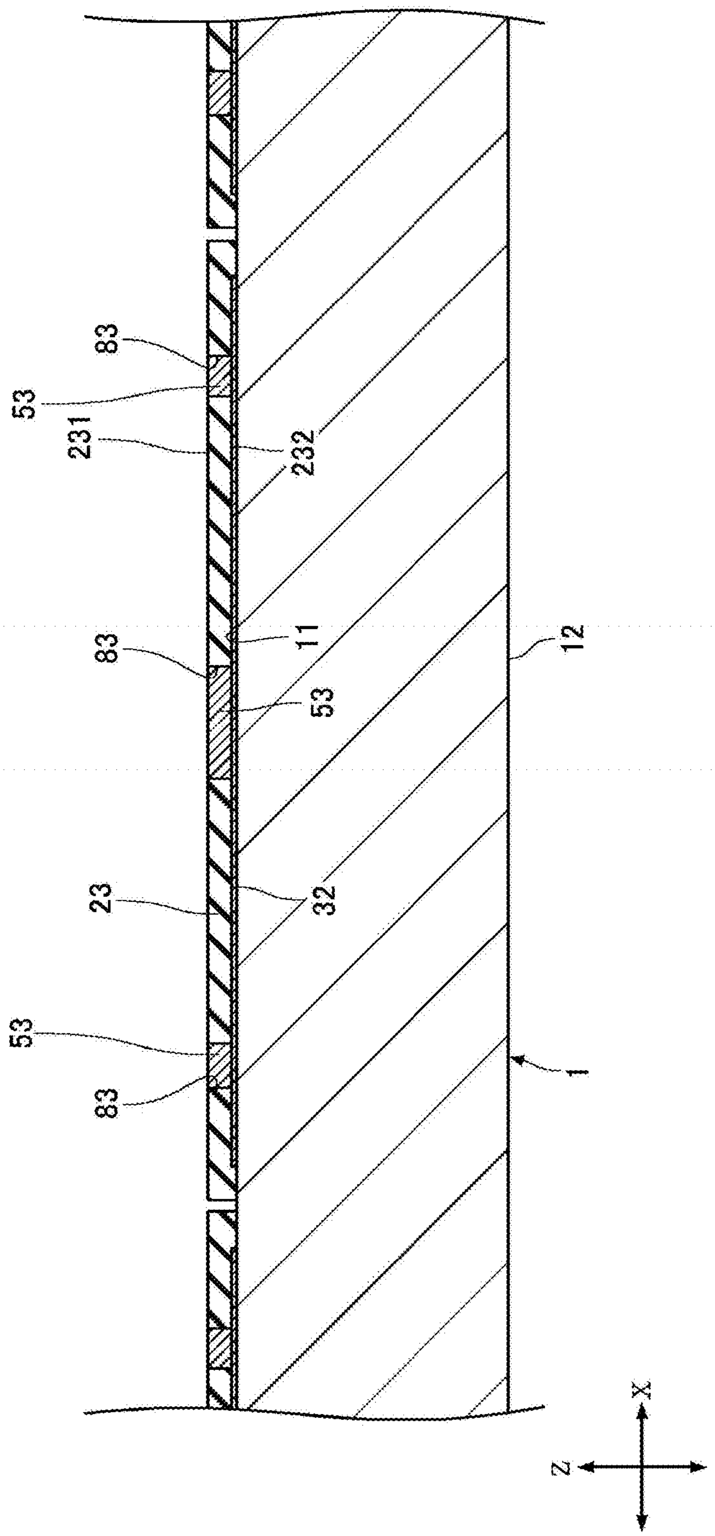
FIG. 17 is a cross-sectional view showing a step of the method for manufacturing the electronic component according to the first embodiment.

Primary Wiring Portion Formation Step:

Next, as shown in FIG. 17, a third wiring portion 53 is formed. The primary wiring portion formation step is a third wiring portion formation step in which the third wiring portion 53 is formed. In this step, the pattern 83 formed in the primary insulating layer formation step is filled with copper plating. In the step of filling with copper plating, a seed layer, for example, is formed by sputtering and/or evaporation on the upper surface of the third insulating layer 23 in which the pattern 83 is formed, and then, a mask having a predetermined pattern is formed. Thereafter, copper plating is formed by electrolytic plating with the seed layer. The seed layer has a laminated structure including a titanium layer and a copper layer, for example. After the electrolytic plating, the mask and the seed layer that are no longer needed are removed. The method for filling with copper plating is not limited to the one described above. The third wiring portion 53 is formed through the formation step described above.

Figure 18:
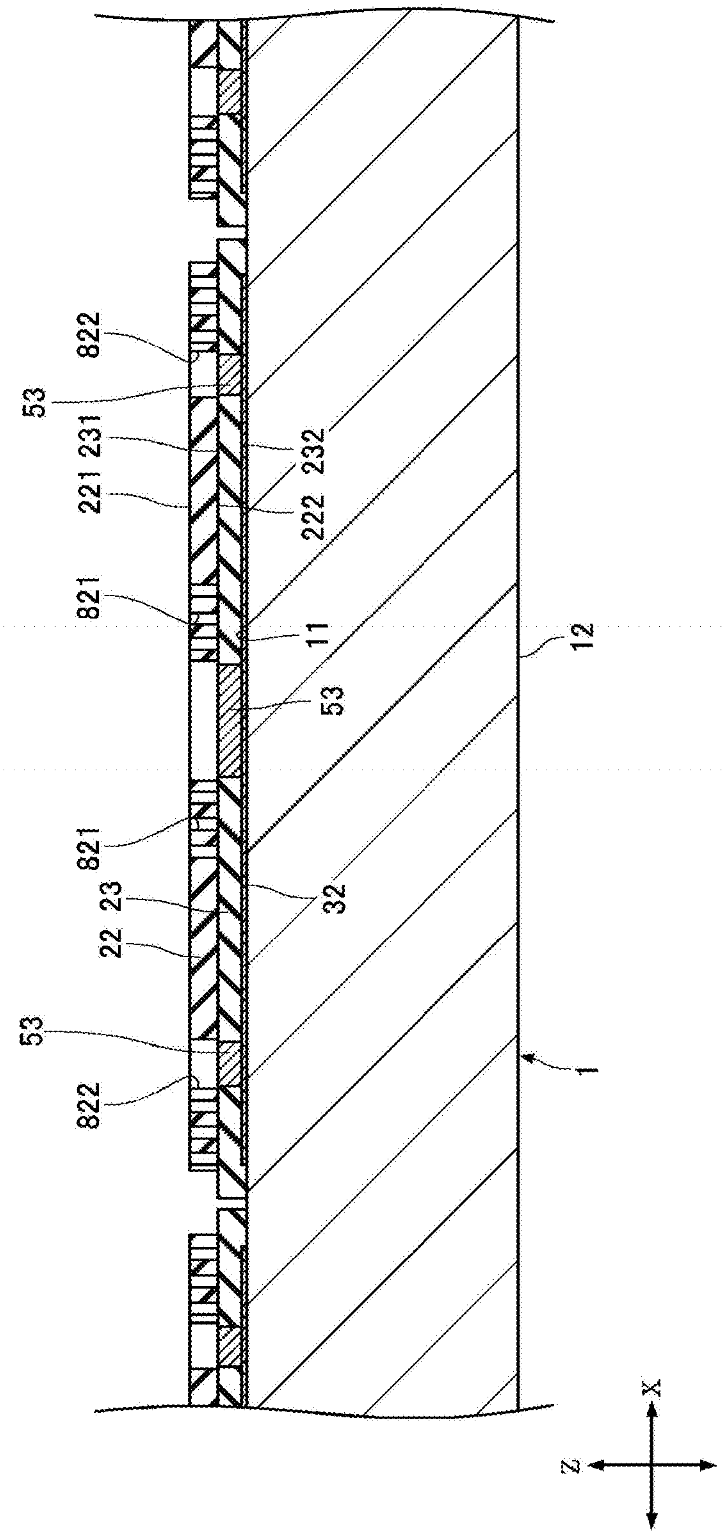
FIG. 18 is a cross-sectional view showing a step of the method for manufacturing the electronic component according to the first embodiment.

Secondary Insulating Layer Formation Step:

Next, as shown in FIG. 18, a second insulating layer 22 is formed. The secondary insulating layer formation step is a second insulating layer formation step in which the second insulating layer 22 is formed. In this step, first, a dry film resist is attached to the third insulating layer 23. The dry film resist contains an epoxy resin as a photosensitive resin, as with the one used in the primary insulating layer formation step. The dry film resist is then patterned by exposing and developing the dry film resist. As a result, a second insulating layer 22 having patterns 821 and 822 is formed as shown in FIG. 18. The patterns 821 and 822 thus formed penetrate through the second insulating layer 22 in the thickness direction z. The pattern 821 corresponds to the area in which an inductor portion 31 (two winding portions 311 and 312) is arranged, and the pattern 822 corresponds to the area in which a second wiring portion 52 is arranged.

Figure 19:
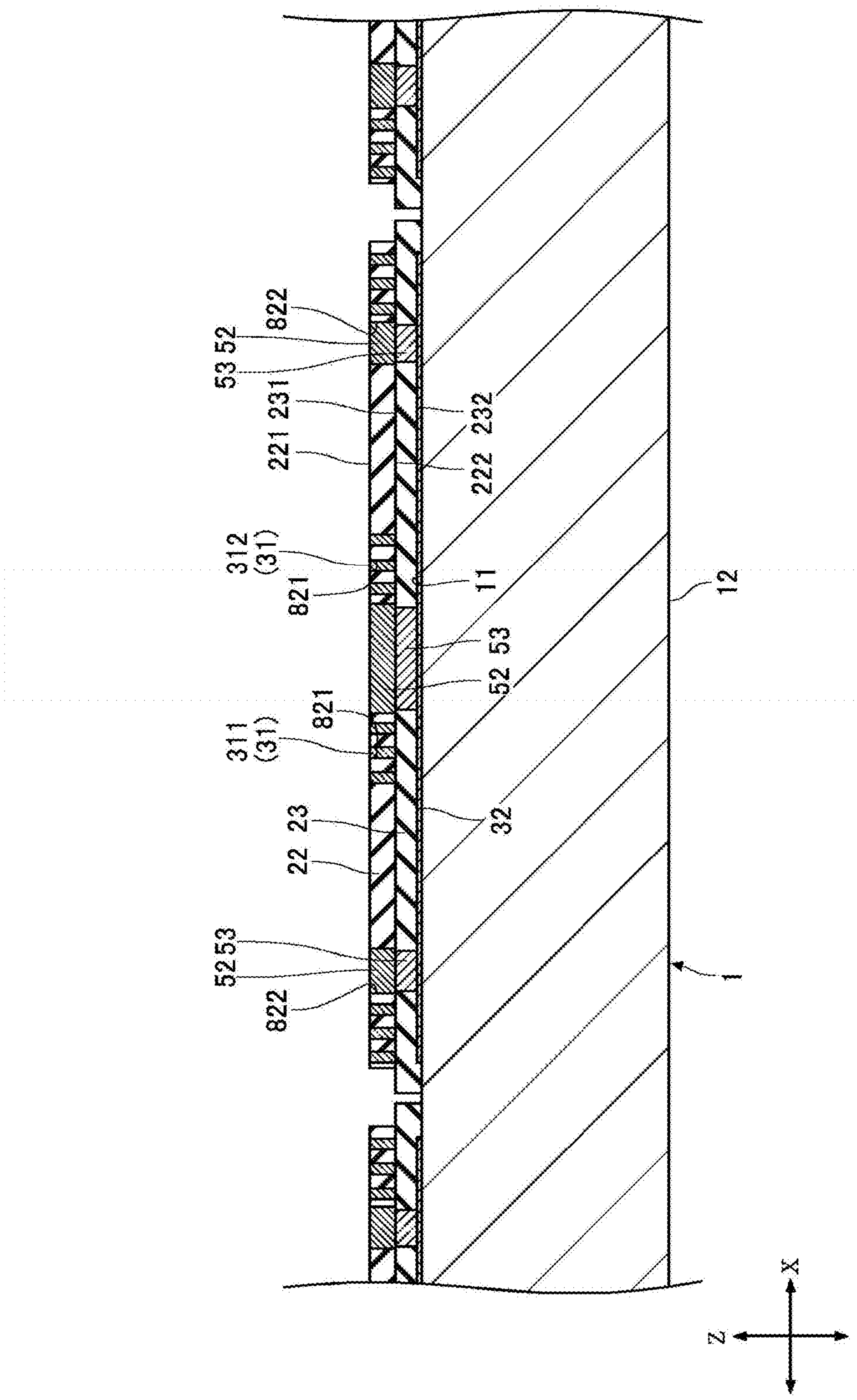
FIG. 19 is a cross-sectional view showing a step of the method for manufacturing the electronic component according to the first embodiment.

Secondary Wiring Portion Formation Step and Inductor Portion Formation Step:

Next, as shown in FIG. 19, an inductor portion 31 and a second wiring portion 52 are formed. The secondary wiring portion formation step is a second wiring portion formation step in which the second wiring portion 52 is formed. In this step, the patterns 821 and 822 formed in the secondary insulating layer formation step are filled with copper plating. The copper plating that fills the pattern 821 forms the inductor portion 31 (the two winding portions 311 and 312), and the copper plating that fills the pattern 822 forms the second wiring portion 52. The filling with copper plating is performed in the same manner as in the primary wiring portion formation step, which involves formation of a seed layer and electrolytic plating. The method for filling with copper plating in the secondary wiring portion formation step and the inductor portion formation step is not limited to this. As described above, the second wiring portion 52 and the inductor portion 31 (the two winding portions 311 and 312) are collectively formed in the present embodiment. It is possible to perform the primary wiring portion formation step, the secondary wiring portion formation step, and the inductor portion formation step in a batch.

Figure 20:
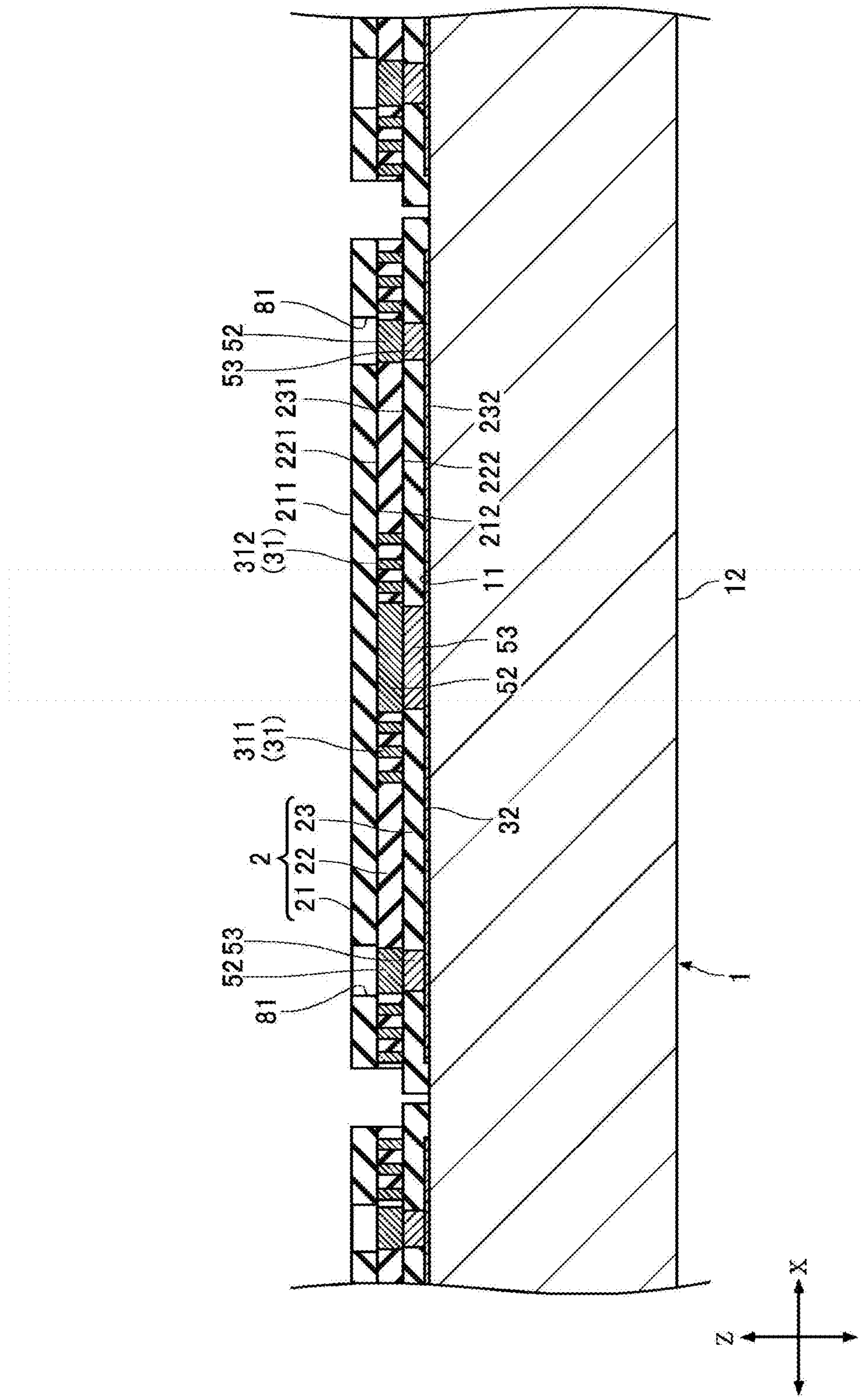
FIG. 20 is a cross-sectional view showing a step of the method for manufacturing the electronic component according to the first embodiment.

Tertiary Insulating Layer Formation Step:

Next, as shown in FIG. 20, a first insulating layer 21 is formed. The tertiary insulating layer formation step is a first insulating layer formation step in which the first insulating layer 21 is formed. In this step, first, a dry film resist is attached to the second insulating layer 22. The dry film resist contains an epoxy resin as a photosensitive resin, as with the ones used in the primary insulating layer formation step and the secondary insulating layer formation step. The dry film resist is then patterned by exposing and developing the dry film resist. As a result, a first insulating layer 21 having a pattern 81 is formed as shown in FIG. 20. The pattern 81 thus formed penetrates through the first insulating layer 21 in the thickness direction z. The pattern 81 corresponds to the area in which a first wiring portion 51 is arranged.

Figure 21:
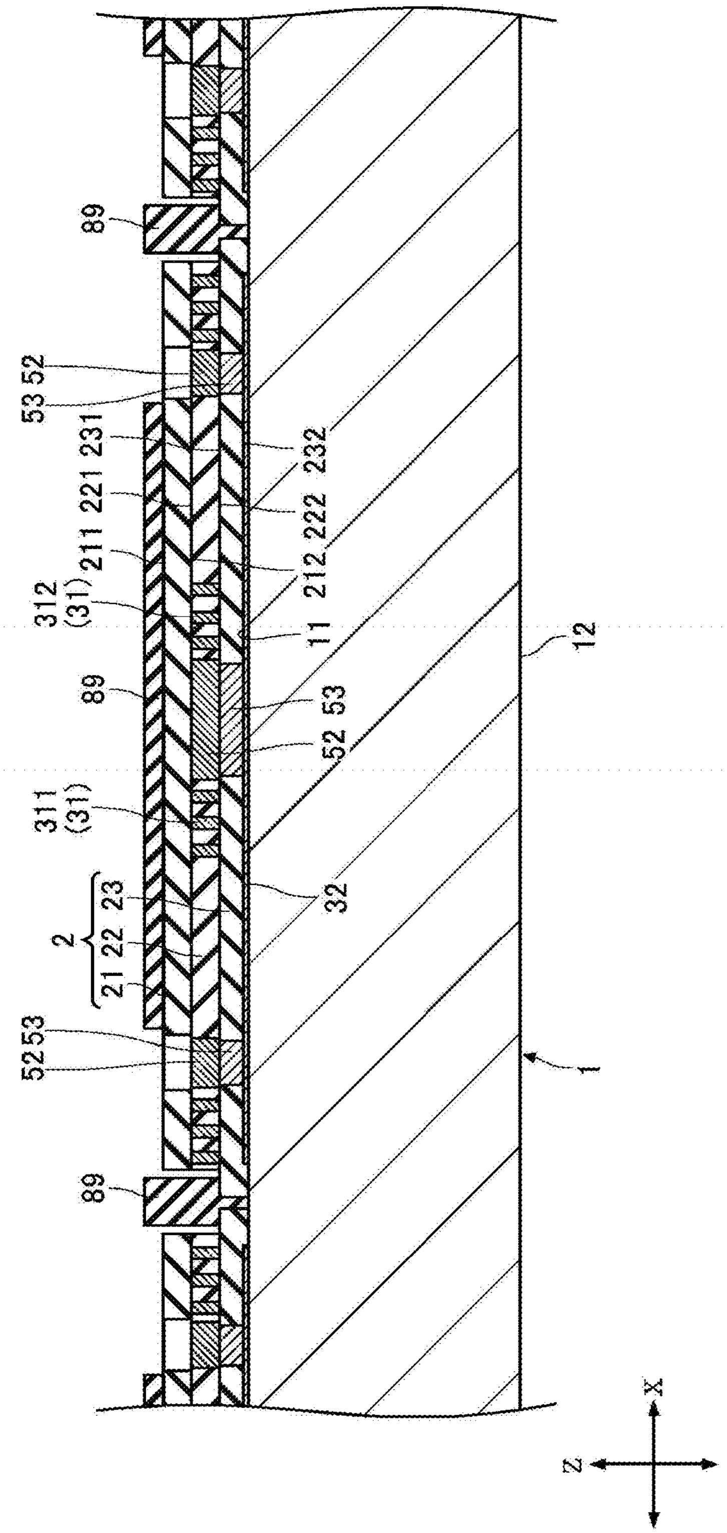
FIG. 21 is a cross-sectional view showing a step of the method for manufacturing the electronic component according to the first embodiment.

Resist Formation Step:

Next, a resist 89 is formed as shown in FIG. 21. The resist 89 may be formed by photolithography. A portion of each end surface (each end surface parallel to the thickness direction z) of the first insulating layer 21 and the second insulating layer 22 and a portion of the upper surface (the surface facing upward in the thickness direction z) of the first insulating layer 21 are exposed from the resist 89.

Figure 22:
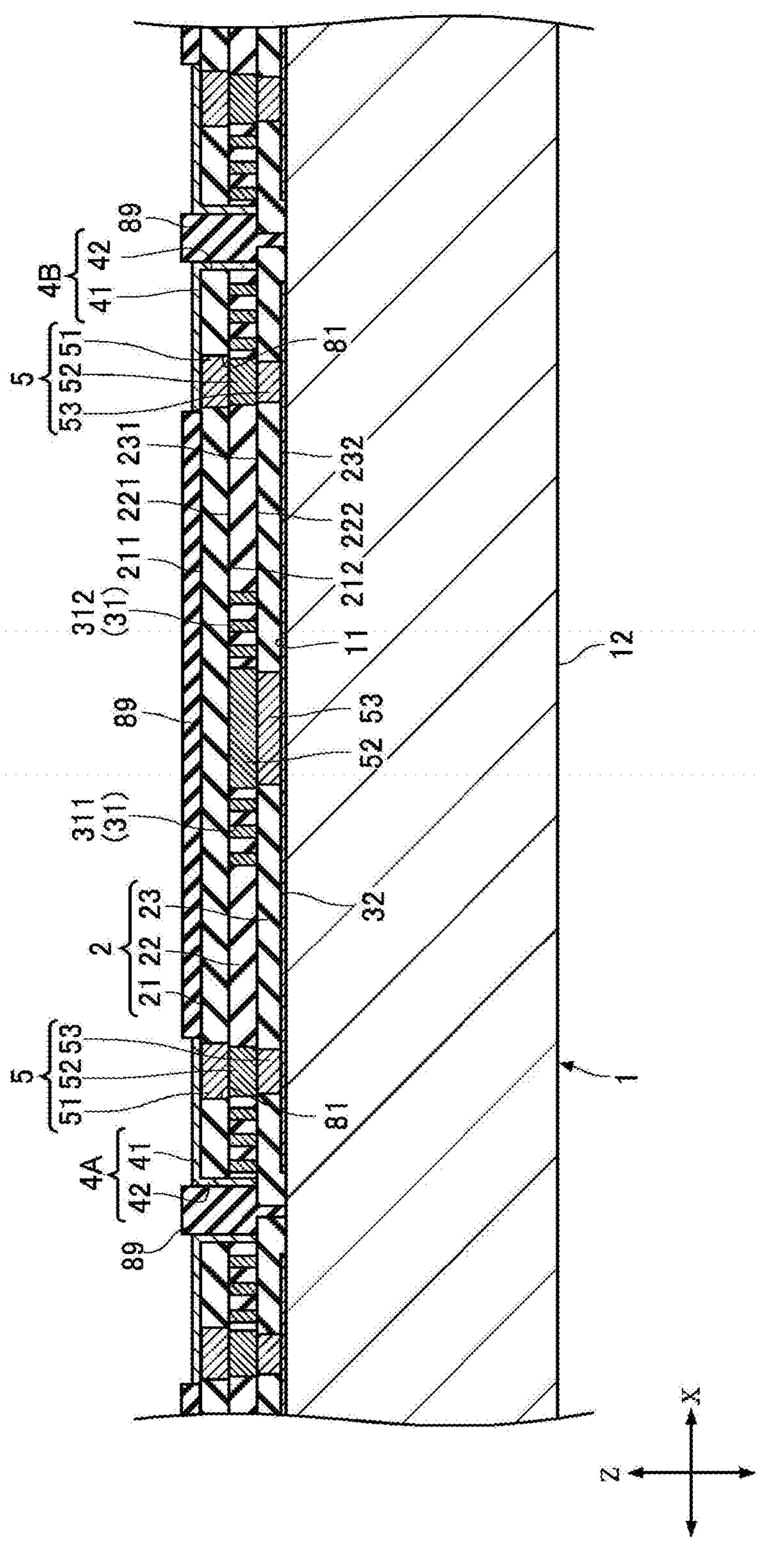
FIG. 22 is a cross-sectional view showing a step of the method for manufacturing the electronic component according to the first embodiment.
Figure 23:
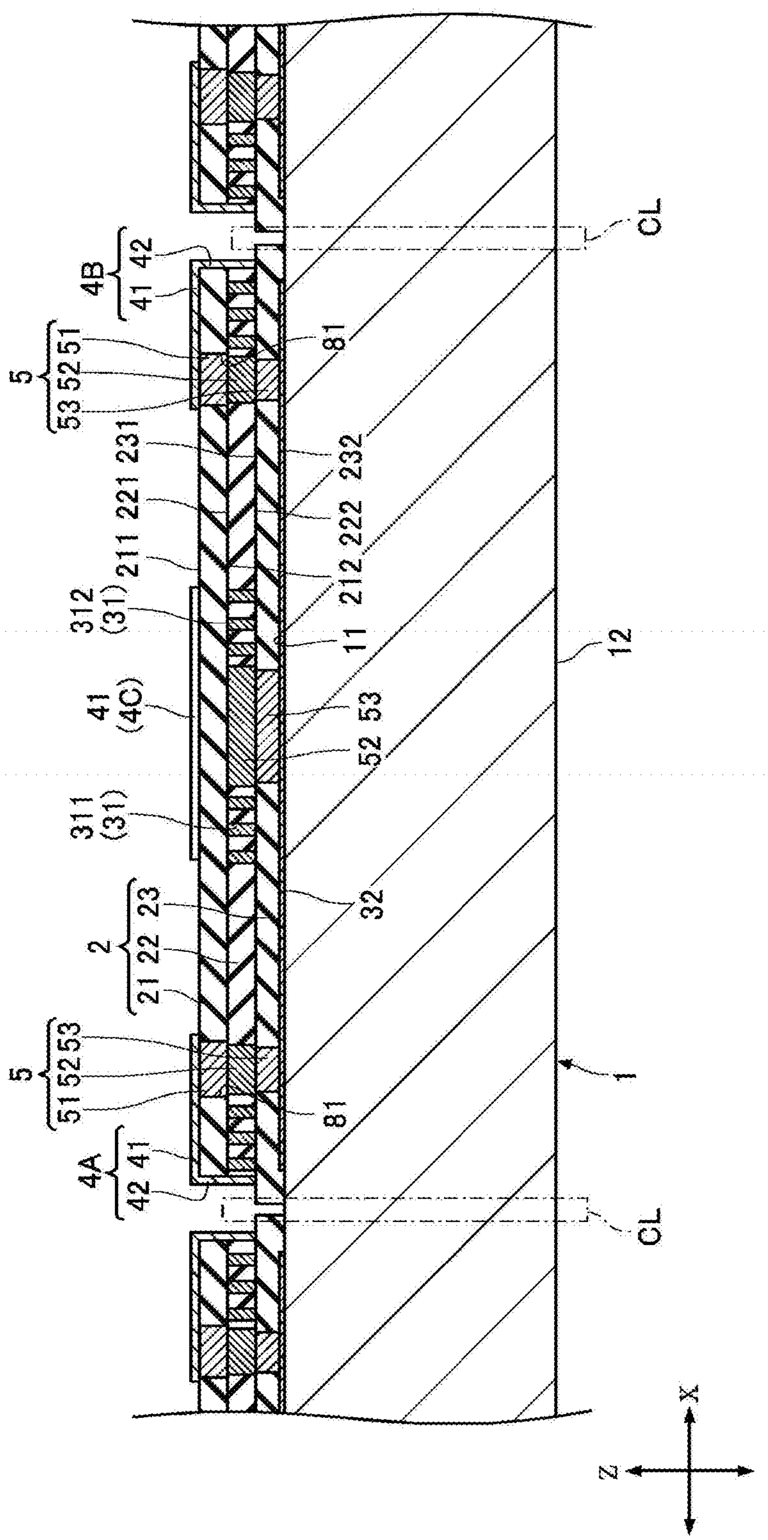
FIG. 23 is a cross-sectional view showing a step of the method for manufacturing the electronic component according to the first embodiment.

Tertiary Wiring Portion Formation Step and External Electrode Formation Step:

Next, as shown in FIGS. 22 and 23, a first wiring portion 51 and a plurality of external electrodes 4A to 4D are formed. The tertiary wiring portion formation step is a first wiring portion formation step in which the first wiring portion 51 is formed. In this step, as shown in FIG. 22, the pattern 81 formed in the tertiary insulating layer formation step and the portions exposed from the resist 89 are filled with copper plating. The first wiring portion 51 is formed by the copper plating shaped by the pattern 81, and the external electrodes 4A to 4D are formed in the portions exposed from the resist 89. The filling with copper plating is performed in the same manner as in the primary wiring portion formation step, which involves formation of a seed layer and electrolytic plating. The method for filling with copper plating in the tertiary wiring portion formation step and the external electrode formation step is not limited to this. As described above, the first wiring portion 51 and the external electrodes 4A to 4D are collectively formed in the present embodiment. Thereafter, the resist 89 is removed as shown in FIG. 23. After the resist 89 is removed, the exposed surfaces of each of the external electrodes 4A to 4D may be plated by electroless plating.

Dicing Step:

Next, as shown in FIG. 23, the insulating substrate 1 and so on are cut along cutting lines CL. The cutting method is not particularly limited, but may be blade dicing or laser dicing. With this step, the insulating substrate 1 is divided into individual pieces. The electronic component A1 as shown in FIGS. 1 to 14 is manufactured through the above steps.

Figure 24:
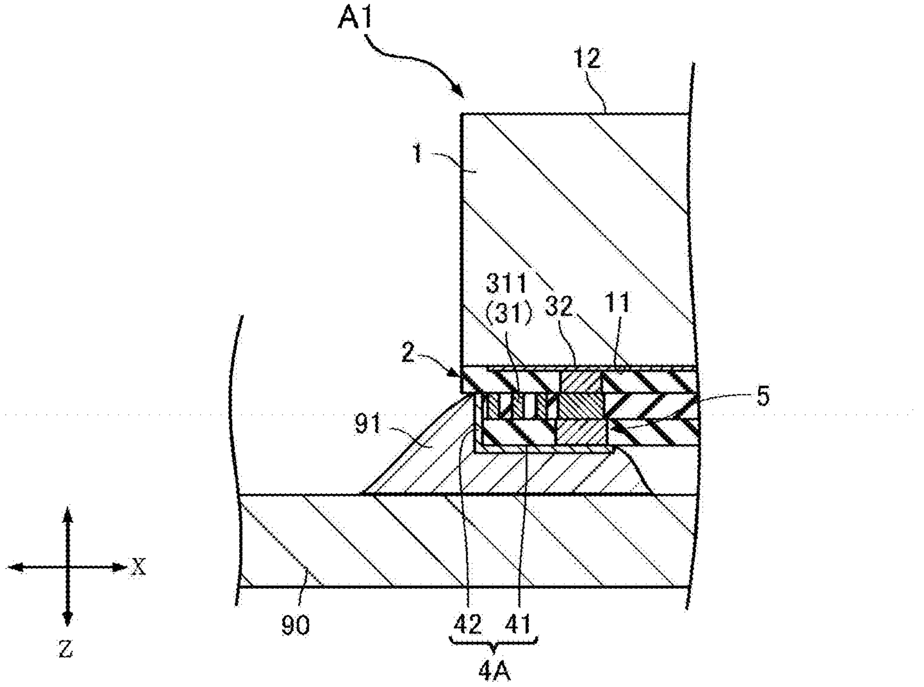
FIG. 24 is a cross-sectional view showing a mounting structure of the electronic component according to the first embodiment.

Next, a mounting structure of the electronic component A1 will be described with reference to FIG. 24. FIG. 24 shows the state where the electronic component A1 is mounted on a circuit board 90 which is a mounting target. As shown in FIG. 24, the electronic component A1 is in the orientation opposite to that shown in FIGS. 1 to 14 in the thickness direction z, and is bonded to the circuit board 90 in that state. Accordingly, the obverse-surface covering portion 41 of each of the external electrodes 4A to 4D faces the circuit board 90. Each of the external electrodes 4A to 4D is bonded to the circuit board 90 via a conductive bonding material 91. The conductive bonding material 91 is solder, for example. As shown in FIG. 24, the conductive bonding material 91 adheres not only to the obverse-surface covering portion 41 of the external electrode 4A but also to the side-surface covering portion 42. Similarly, in each of the external electrodes 4B to 4D, the conductive bonding material 91 adheres to the side-surface covering portion 42 as well as to the obverse-surface covering portion 41.

The following describes the advantages of the electronic component A1 and the method for manufacturing the electronic component A1.

The electronic component A1 includes the external electrode 4A (4B to 4D) electrically connected to the functional portion 3. The external electrode 4A (4B to 4D) includes the obverse-surface covering portion 41 covering the first obverse surface 211, and the side-surface covering portion 42 covering the first side surface 213 (214 to 216). In the configuration where the external electrode 4A (4B to 4D) includes the side-surface covering portion 42, the conductive bonding material 91 also adheres to the side-surface covering portion 42 as shown in FIG. 24. Thus, the bonding area of the conductive bonding material 91 with respect to the external electrode 4A (4B to 4D) increases as compared to the configuration where the external electrode 4A (4B to 4D) does not include the side-surface covering portion 42. As such, the electronic component A1 can enhance the bonding strength to the mounting target. Further, as can be understood from FIG. 24, a portion of the conductive bonding material 91 is formed outside the electronic component A1 in plan view. This makes it easy to visually inspect the adherence state of the conductive bonding material 91 with respect to the external electrode 4A (4B to 4D). The visual inspection allows checking whether the conductive bonding material 91 is formed properly and determining whether the bonding state is defective. Further, the present inventor simulated von Mises stress when a load is applied from a side of the electronic component between the case where the external electrode 4A (4B to 4D) includes the side-surface covering portion 42 and the case where the external electrode 4A (4B to 4D) does not include the side-surface covering portion 42. As a result of the simulation, von Mises stress was alleviated when the external electrode 4A (4B to 4D) included the side-surface covering portion 42 as compared to when the external electrode 4A (4B to 4D) did not include the side-surface covering portion 42. In other words, the electronic component A1 can alleviate the stress applied thereto and improve the stability of the bonding state when the external electrode 4A (4B to 4D) is provided with the side-surface covering portion 42. Thus, the electronic component A1 can be bonded to the mounting target more properly when the external electrode 4A (4B to 4D) is provided with the side-surface covering portion 42 as compared to when the external electrode 4A (4B to 4D) is not provided with the side-surface covering portion 42. Further, according to the manufacturing method of the present disclosure, it is possible to manufacture the electronic component A1 that can be bonded to the mounting target properly.

In the electronic component A1, the sealing member 2 includes the first insulating layer 21, the second insulating layer 22, and the third insulating layer 23, and the inductor portion 31 is formed in the second insulating layer 22. This configuration can prevent the inductor portion 31 from electrically connecting to other portions without intention even when the inductor portion 31 penetrates through the second insulating layer 22 in the thickness direction z. Thus, according to the electronic component A1, it is possible to prevent an accidental electrical connection of the inductor portion 31 while increasing the Q factor by increasing the dimension of the inductor portion 31 in the thickness direction z.

The following describes other embodiments and variations of the electronic component of the present disclosure. The configurations of the elements in each of the embodiments and the variations can be combined as appropriate as long as the combination does not cause technical contradictions.

Figure 25:
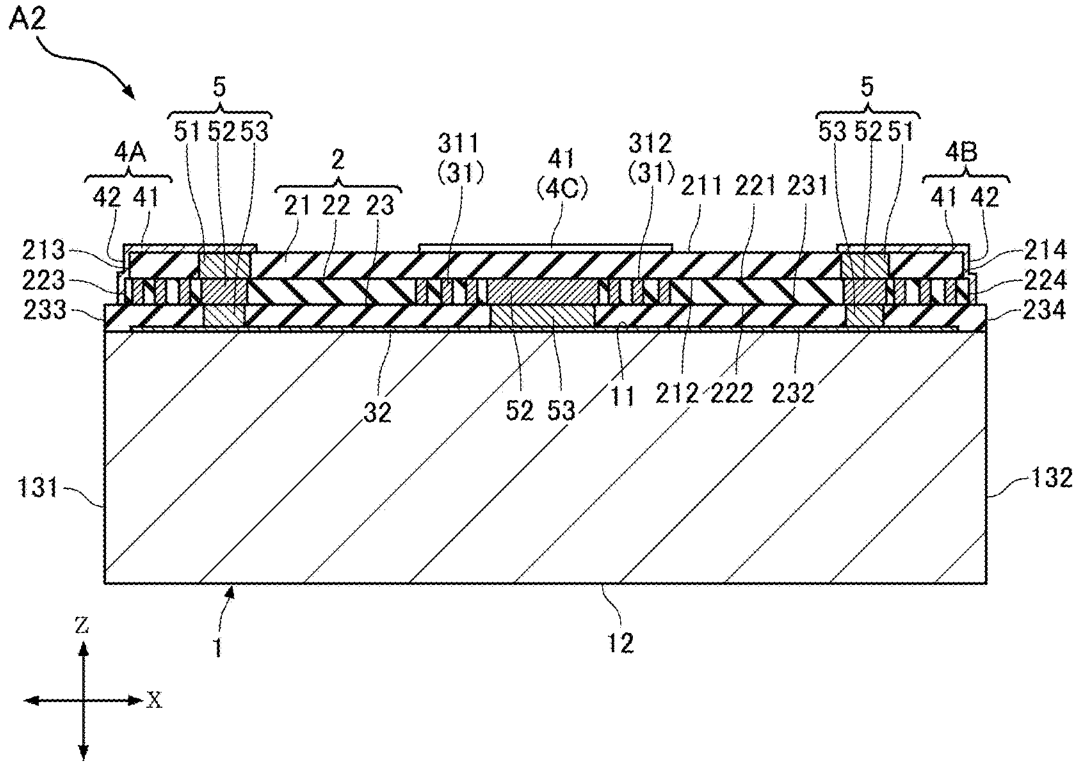
FIG. 25 is a cross-sectional view showing an electronic component according to a second embodiment, and corresponds to the cross section in FIG. 12.

FIG. 25 shows an electronic component A2 according to a second embodiment. The electronic component A2 is different from the electronic component A1 in the following point. As can be understood from FIG. 25, the first side surfaces 213 to 216 of the first insulating layer 21 are located inside the second side surfaces 223 to 226 of the second insulating layer 22, respectively, in plan view.

Due to the configuration described above, the sealing member 2 of the electronic component A2 has a step at each of the first side surfaces 213 to 216 of the first insulating layer 21 and each of the second side surfaces 223 to 226 of the second insulating layer 22. Thus, the side-surface covering portion 42 of each of the external electrodes 4A to 4D also has a step.

Figure 26:
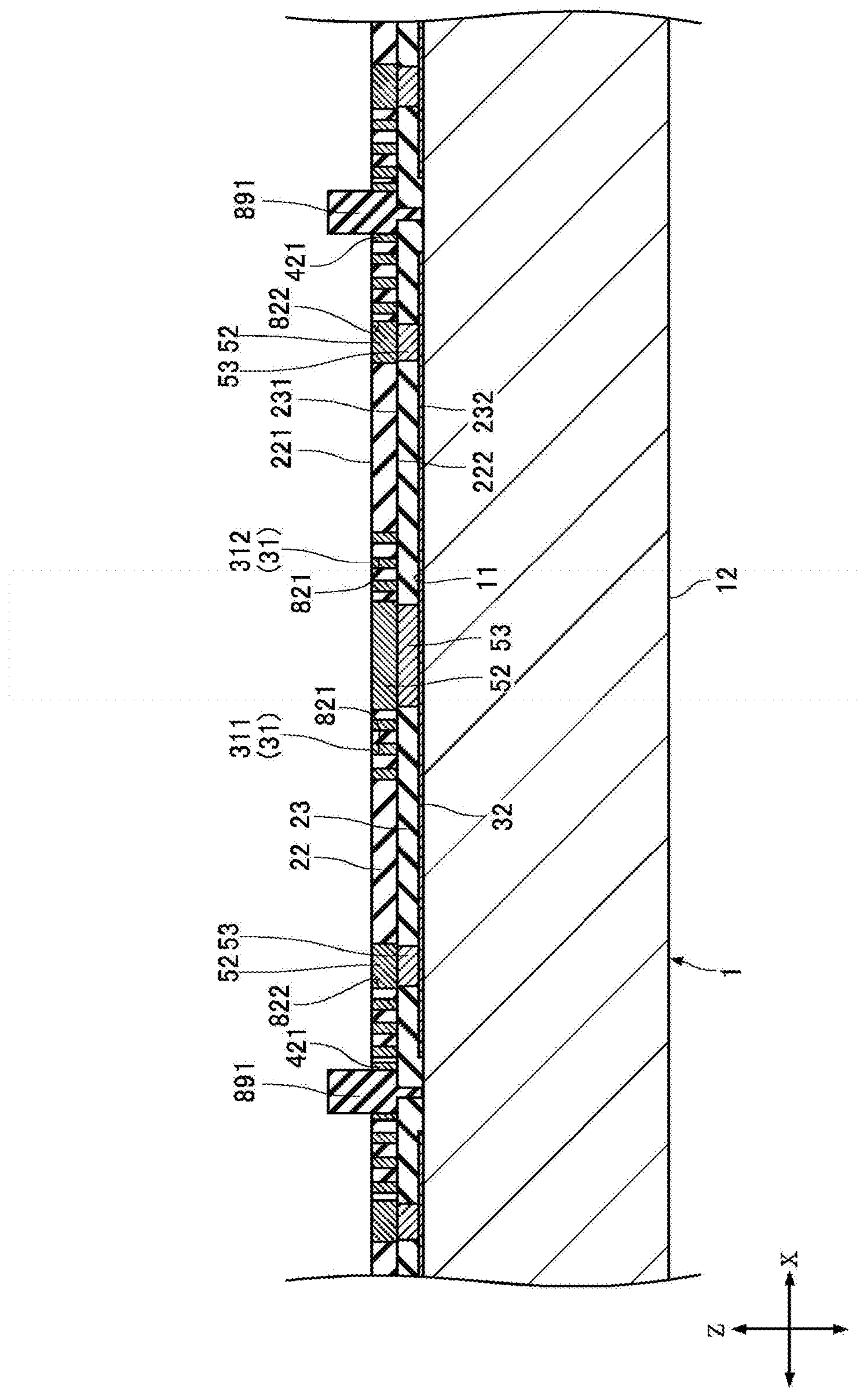
FIG. 26 is a cross-sectional view showing a step of the method for manufacturing the electronic component according to the second embodiment.
Figure 27:
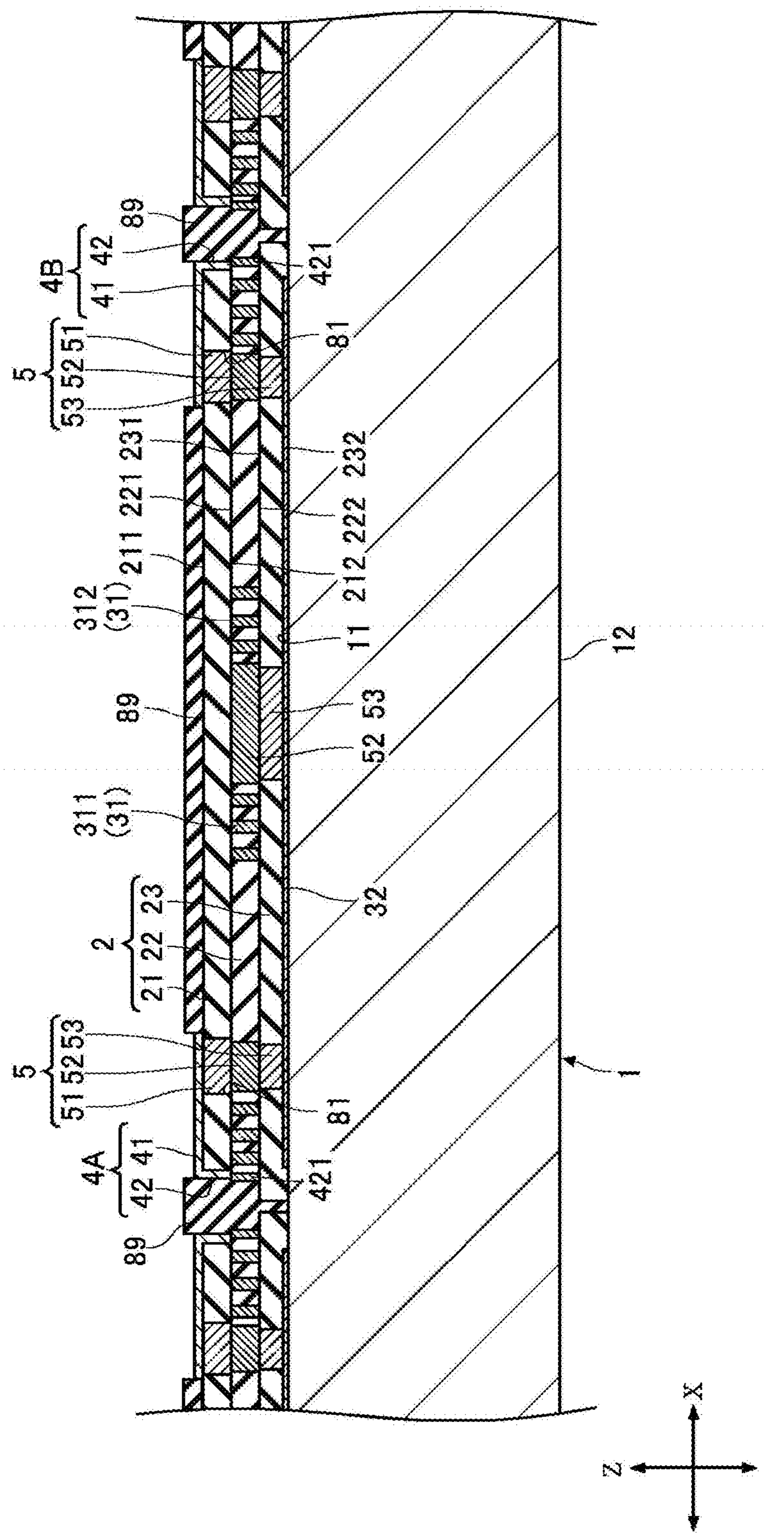
FIG. 27 is a cross-sectional view showing a step of the method for manufacturing the electronic component according to the second embodiment.

The manufacturing method of the electronic component A2 is different from that of the electronic component A1 in the secondary wiring portion formation step and the inductor portion formation step, and also in the resist formation step. FIGS. 26 and 27 each show a step of the manufacturing method of the electronic component A2. FIG. 26 is a cross-sectional view showing a secondary wiring portion formation step and an inductor portion formation step in the manufacturing method of the electronic component A2. FIG. 27 is a cross-sectional view showing a resist formation step, a tertiary wiring portion formation step, and an external electrode formation step in the manufacturing method of the electronic component A2.

As shown in FIG. 26, in the secondary wiring portion formation step and the inductor portion formation step in the manufacturing method of the electronic component A2, a resist 891 is formed before filling the patterns 821 and 822 formed in the secondary insulating layer formation step with copper plating. Then, when copper plating is poured, a portion of the side-surface covering portion 42 of each of the external electrodes 4A to 4D (a partial covering portion 421 covering a portion of each of the second side surfaces 223 to 226 of the second insulating layer 22) is formed.

As shown in FIG. 27, in the resist formation step in the manufacturing method of the electronic component A2, the resist 89 is formed such that at least a portion of the partial covering portion 421 is exposed. Then, processes similar to those in the tertiary wiring portion formation step and the external electrode formation step in the manufacturing method of the electronic component A1 can be performed so as to form a step on the side-surface covering portion 42.

The electronic component A2 is similar to the electronic component A1 in that the external electrode 4A (4B to 4D) includes the side-surface covering portion 42. As such, the electronic component A2 can be bonded to the mounting target more properly as compared to when the external electrode 4A (4B to 4D) does not include the side-surface covering portion 42. Further, the electronic component A2 has a step at the side-surface covering portion 42 of each of the external electrodes 4A to 4D, which allows the conductive bonding material 91 to easily form a fillet when the electronic component A2 is mounted on the circuit board 90. Accordingly, the electronic component A2 makes visual inspection even easier.

Figure 28:
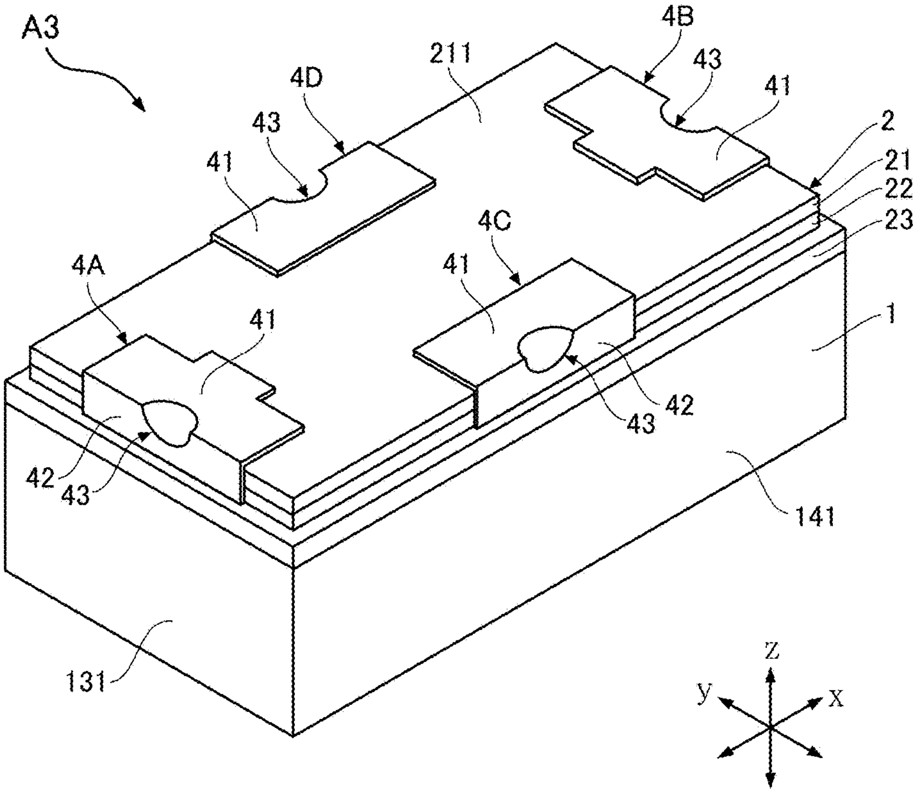
FIG. 28 is a perspective view showing an electronic component according to a third embodiment.

FIG. 28 shows an electronic component A3 according to a third embodiment. The electronic component A3 is different from the electronic component A1 in that each of the external electrodes 4A to 4D is formed with a dimple 43.

As can be understood from FIG. 28, the dimple 43 is a semicircular dent in plan view. The electronic component A3 is formed by appropriately modifying the shape of a photosensitive resin (a dry film resist) in each of the primary to tertiary insulating layer formation steps and the shape of a resist (e.g., a resist 89 or 891) in each of the primary to tertiary wiring portion formation steps and the resist formation step, and additionally arranging them.

The electronic component A3 is similar to the electronic component A1 in that the external electrode 4A (4B to 4D) includes the side-surface covering portion 42. As such, the electronic component A3 can be bonded to the mounting target more properly as compared to when the external electrode 4A (4B to 4D) does not include the side-surface covering portion 42. Further, the electronic component A3 has a similar advantage to the electronic component A2 owing to the dimples 43, which allow the conductive bonding material 91 to easily form a fillet when the electronic component A3 is mounted on the circuit board 90. Accordingly, as with the electronic component A2, the electronic component A3 makes visual inspection even easier.

Figure 29:
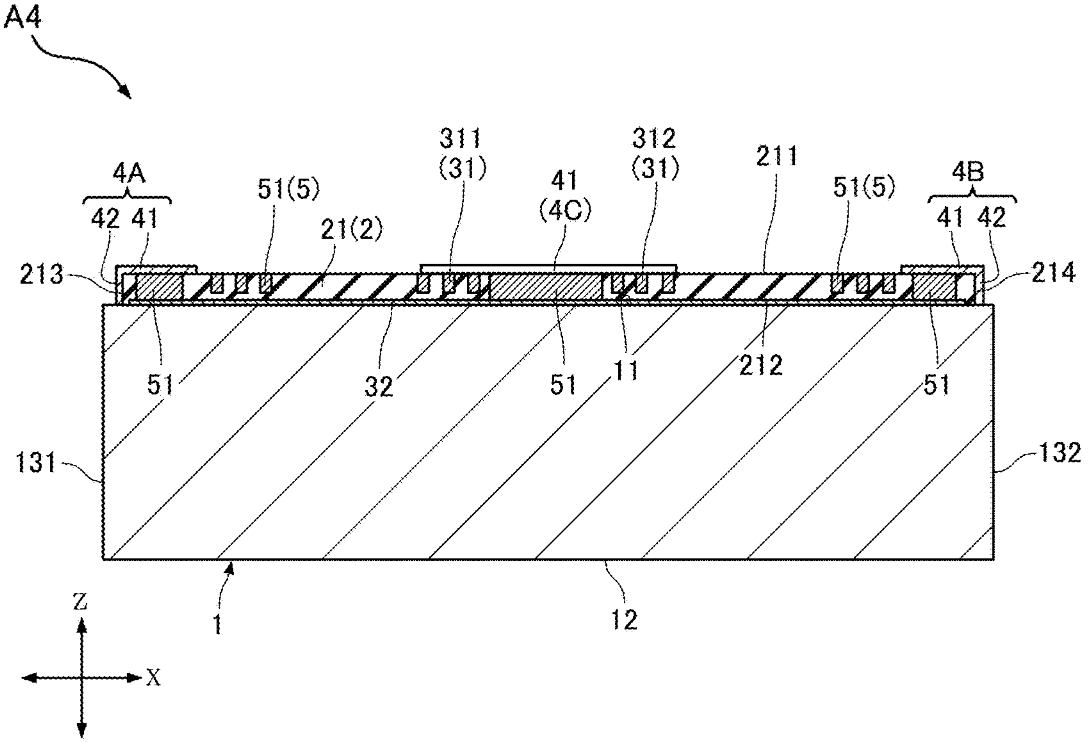
FIG. 29 is a cross-sectional view showing an electronic component according to a fourth embodiment, and corresponds to the cross section in FIG. 12.

FIG. 29 shows an electronic component A4 according to a fourth embodiment. The electronic component A4 is different from the electronic component A1 in that the sealing member 2 is configured with a single layer, namely the first insulating layer 21.

Since the sealing member 2 of the electronic component A4 is composed of a single layer, namely the first insulating layer 21, the inductor portion 31 is formed in the first insulating layer 21 as shown in FIG. 29. In the illustrated example, the inductor portion 31 does not penetrate through the first insulating layer 21 in the thickness direction z. This makes it possible to prevent an accidental electrical connection between the inductor portion 31 and the capacitor portion 32. However, in the configuration where the inductor portion 31 does not penetrate through the first insulating layer 21 in the thickness direction z, the dimension of the inductor portion 31 is decreased in the thickness direction z, and this may result in a decrease in the Q factor of the inductor portion 31. Thus, in order to suppress a decrease in the Q factor of the inductor portion 31 and prevent an accidental electrical connection between the inductor portion 31 and the capacitor portion 32, it is preferable that the sealing member 2 include a plurality of insulating layers, and that the inductor portion 31 be formed in and penetrate through one of the insulating layers. Unlike the illustrated example, the inductor portion 31 may penetrate through the first insulating layer 21 in the thickness direction z.

The electronic component A4 is similar to the electronic component A1 in that the external electrode 4A (4B to 4D) includes the side-surface covering portion 42. As such, the electronic component A4 can be bonded to the mounting target more properly as compared to when the external electrode 4A (4B to 4D) does not include the side-surface covering portion 42. As can be understood from the present embodiment, the number of insulating layers of the sealing member 2 is not particularly limited in the electronic component of the present disclosure. Note that an increase in the number of insulating layers increases the thickness (the dimension in the thickness direction z) of the sealing member in the present disclosure, leading to an increase in the thickness of the electronic component. Accordingly, the number of insulating layers of the sealing member 2 is preferably about three to seven in order to suppress an increase in the size of the electronic component.

Figure 30:
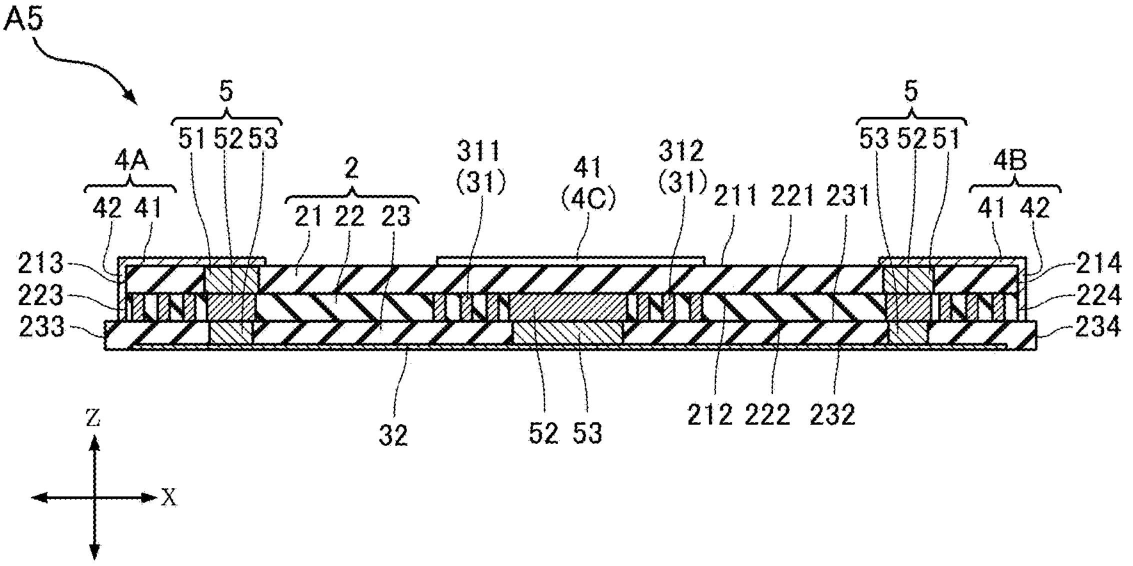
FIG. 30 is a cross-sectional view showing an electronic component according to a fifth embodiment, and corresponds to the cross section in FIG. 12.

FIG. 30 shows an electronic component A5 according to a fifth embodiment. The electronic component A5 is different from the electronic component A1 in not including the insulating substrate 1.

The insulating substrate 1 may be ground off in the manufacturing process of the electronic component A5, whereby the insulating substrate 1 is removed from the electronic component A5. It is possible to reduce the thickness (the dimension in the thickness direction z) of the insulating substrate 1, instead of removing the insulating substrate 1 by grinding the insulating substrate 1.

The electronic component A5 is similar to the electronic component A1 in that the external electrode 4A (4B to 4D) includes the side-surface covering portion 42. As such, the electronic component A5 can be bonded to the mounting target more properly as compared to when the external electrode 4A (4B to 4D) does not include the side-surface covering portion 42. Further, the electronic component A5 is preferable for thinning because it does not include the insulating substrate 1.

In the first to fifth embodiments, the functional portion 3 of each of the electronic components A1 to A5 includes an inductor portion 31 and a capacitor portion 32; however, it may be configured to include only one of the inductor portion 31 and the capacitor portion 32. Further, the functional portion 3 of each of the electronic components A1 to A5 may include one or a combination selected from among, for example, an inductor, a capacitor, a transistor, a resistor, and a diode.

The electronic component and the manufacturing method thereof according to the present disclosure are not limited to those in the above embodiments. Various design changes can be made to the specific configurations of the elements of the electronic component according to the present disclosure, and to the specific processes in the in the manufacturing method according to the present disclosure. The present disclosure includes the embodiments described in the following clauses.

Clause 1.

An electronic component comprising:

a functional portion;

a first insulating layer including a first obverse surface facing a first side in a thickness direction, and a first side surface facing a first side in a first direction intersecting the thickness direction;

an external electrode electrically connected to the functional portion; and a wiring portion electrically connecting the functional portion and the external electrode, wherein the external electrode includes an obverse-surface covering portion covering the first obverse surface, and a side-surface covering portion covering the first side surface.

Clause 2.

The electronic component according to clause 1, wherein the functional portion includes an inductor portion.

Clause 3.

The electronic component according to clause 2, further comprising: a second insulating layer including a second obverse surface facing the first side in the thickness direction, and a second side surface facing the first side in the first direction; and a third insulating layer including a third obverse surface facing the first side in the thickness direction, wherein the first insulating layer is stacked on the second obverse surface, and the second insulating layer is stacked on the third obverse surface.

Clause 4.

The electronic component according to clause 3, wherein the inductor portion is formed in the second insulating layer.

Clause 5.

The electronic component according to clause 3 or 4, wherein the side-surface covering portion extends from the first side surface to the second side surface.

Clause 6.

The electronic component according to any of clauses 3 to 5, wherein as viewed in the thickness direction, the first side surface is located inside the second side surface.

Clause 7.

The electronic component according to any of clauses 3 to 6, wherein the functional portion includes a capacitor portion.

Clause 8.

The electronic component according to clause 7, further comprising: an insulating substrate, wherein the insulating substrate includes a substrate obverse surface facing the first side in the thickness direction, and the third insulating layer is arranged on the substrate obverse surface.

Clause 9.

The electronic component according to clause 8, wherein the capacitor portion is located between the insulating substrate and the third insulating layer in the thickness direction.

Clause 10.

A method for manufacturing an electronic component, comprising:

a functional portion formation step of forming a functional portion;

a first insulating layer formation step of forming a first insulating layer that includes a first obverse surface facing a first side in a thickness direction, and a first side surface facing a first side in a first direction intersecting the thickness direction;

a wiring portion formation step of forming a wiring portion; and an external electrode formation step of forming an external electrode that includes an obverse-surface covering portion covering the first obverse surface, and a side-surface covering portion covering the first side surface, wherein the wiring portion includes a first wiring portion formed in the first insulating layer, each of the side-surface covering portion and the first wiring portion is connected to the obverse-surface covering portion, and the obverse-surface covering portion, the side-surface covering portion, and the first wiring portion are collectively formed in the wiring portion formation step and the external electrode formation step.

Clause 11.

The method according to clause 10, further comprising: a substrate preparation step of preparing an insulating substrate that includes a substrate obverse surface facing the first side in the thickness direction, wherein the functional portion, the first insulating layer, and the wiring portion are arranged on the substrate obverse surface.

Clause 12.

The method according to clause 10 or 11, further comprising:

a second insulating layer formation step of forming a second insulating layer that includes a second obverse surface facing the first side in the thickness direction; and a third insulating layer formation step of forming a third insulating layer that includes a third obverse surface facing the first side in the thickness direction, wherein the second insulating layer is stacked on the third obverse surface in the second insulating layer formation step, and the first insulating layer is stacked on the second obverse surface in the first insulating layer formation step.

Clause 13.

The method according to clause 12, wherein the wiring portion formation step includes a first wiring portion formation step of forming the first wiring portion, and the first wiring portion penetrates through the first insulating layer in the thickness direction.

Clause 14.

The method according to clause 13, wherein the wiring portion formation step includes a second wiring portion formation step of forming a second wiring portion that penetrates through the second insulating layer in the thickness direction, and the first wiring portion and the second wiring portion are electrically connected to each other.

Clause 15.

The method according to clause 14, wherein the functional portion includes an inductor portion, and the functional portion formation step includes an inductor portion formation step of forming the inductor portion in the second insulating layer.

Clause 16.

The method according to clause 14 or 15, wherein the wiring portion formation step includes a third wiring portion formation step of forming a third wiring portion that penetrates through the third insulating layer in the thickness direction, and the second wiring portion and the third wiring portion are electrically connected to each other.

Clause 17.

The method according to any of clauses 12 to 16, wherein each of the first insulating layer, the second insulating layer, and the third insulating layer is formed of a dry film resist.

| REFERENCE NUMERALS |
|---|
| A1-A5: Electronic component |
| 1: Insulating substrate |
| 11: Substrate obverse surface |
| 12: Substrate reverse surface |
| 131-134: Substrate side surface |
| 2: Sealing member |
| 21: First insulating layer |
| 211: First obverse surface |
| 212: First reverse surface |
| 213-216: First side surface |
| 22: Second insulating layer |
| 221: Second obverse surface |
| 222: Second reverse surface |
| 223-226: Second side surface |
| 23: Third insulating layer |
| 231: Third obverse surface |
| 232: Third reverse surface |
| 233-236: Third side surface |
| 3: Functional portion |

-continued

| REFERENCE NUMERALS |
|---|
| 31: Inductor portion |
| 311, 312: Winding portion |
| 32: Capacitor portion |
| 4A-4D: External electrode |
| 41: Obverse-surface covering portion |
| 42: Side-surface covering portion |
| 421: Partial covering portion |
| 43: Dimple |
| 5: Wiring portion |
| 51: First wiring portion |
| 52: Second wiring portion |
| 53: Third wiring portion |
| 81, 821, 822, 83: Pattern |
| 89, 891: Resist |
| 90: Circuit board |
| 91: Conductive bonding material |

The invention claimed is:

1. An electronic component comprising:

a functional portion;

a first insulating layer including a first obverse surface facing a first side in a thickness direction, and a first side surface facing a first side in a first direction intersecting the thickness direction;

a second insulating layer including a second obverse surface facing the first side in the thickness direction, and a second side surface facing the first side in the first direction;

a third insulating layer including a third obverse surface facing the first side in the thickness direction;

an external electrode electrically connected to the functional portion; and a wiring portion electrically connecting the functional portion and the external electrode, wherein the external electrode includes an obverse-surface covering portion covering the first obverse surface, and a side-surface covering portion covering the first side surface, the functional portion includes an inductor portion, the first insulating layer is stacked on the second obverse surface, and the second insulating layer is stacked on the third obverse surface, and as viewed in the thickness direction, the first side surface is located inside the second side surface.

2. The electronic component according to claim 1, wherein the inductor portion is formed in the second insulating layer.

3. The electronic component according to claim 1, wherein the side-surface covering portion extends from the first side surface to the second side surface.

4. The electronic component according to claim 1, wherein the functional portion includes a capacitor portion.

5. The electronic component according to claim 4, further comprising: an insulating substrate, wherein the insulating substrate includes a substrate obverse surface facing the first side in the thickness direction, and the third insulating layer is arranged on the substrate obverse surface.

6. The electronic component according to claim 5, wherein the capacitor portion is located between the insulating substrate and the third insulating layer in the thickness direction.

7. A method for manufacturing an electronic component, comprising:

a functional portion formation step of forming a functional portion;

a first insulating layer formation step of forming a first insulating layer that includes a first obverse surface facing a first side in a thickness direction, and a first side surface facing a first side in a first direction intersecting the thickness direction;

a second insulating layer formation step of forming a second insulating layer that includes a second obverse surface facing the first side in the thickness direction;

a third insulating layer formation step of forming a third insulating layer that includes a third obverse surface facing the first side in the thickness direction;

a wiring portion formation step of forming a wiring portion; and an external electrode formation step of forming an external electrode that includes an obverse-surface covering portion covering the first obverse surface, and a side-surface covering portion covering the first side surface, wherein the wiring portion includes a first wiring portion formed in the first insulating layer, each of the side-surface covering portion and the first wiring portion is connected to the obverse-surface covering portion, and the obverse-surface covering portion, the side-surface covering portion, and the first wiring portion are collectively formed in the wiring portion formation step and the external electrode formation step, the second insulating layer is stacked on the third obverse surface in the second insulating layer formation step, and the first insulating layer is stacked on the second obverse surface in the first insulating layer formation step, the second insulating layer further includes a second side surface facing the first side in the first direction, and as viewed in the thickness direction, the first side surface is located inside the second side surface.

8. The method according to claim 7, further comprising: a substrate preparation step of preparing an insulating substrate that includes a substrate obverse surface facing the first side in the thickness direction, wherein the functional portion, the first insulating layer, and the wiring portion are arranged on the substrate obverse surface.

9. The method according to claim 7, wherein the wiring portion formation step includes a first wiring portion formation step of forming the first wiring portion, and the first wiring portion penetrates through the first insulating layer in the thickness direction.

10. The method according to claim 9, wherein the wiring portion formation step includes a second wiring portion formation step of forming a second wiring portion that penetrates through the second insulating layer in the thickness direction, and the first wiring portion and the second wiring portion are electrically connected to each other.

11. The method according to claim 10, wherein the functional portion includes an inductor portion, and the functional portion formation step includes an inductor portion formation step of forming the inductor portion in the second insulating layer.

12. The method according to claim 10, wherein the wiring portion formation step includes a third wiring portion formation step of forming a third wiring portion that penetrates through the third insulating layer in the thickness direction, and the second wiring portion and the third wiring portion are electrically connected to each other.

13. The method according to claim 7, wherein each of the first insulating layer, the second insulating layer, and the third insulating layer is formed of a dry film resist.

14. The electronic component according to claim 1, wherein the wiring portion includes: a first wiring portion penetrating through the first insulating layer in the thickness direction; a second wiring portion penetrating through the second insulating layer in the thickness direction; and a third wiring portion penetrating through the third insulating layer, and the first wiring portion, the second wiring portion and the third wiring portion includes respective portions that overlap with each other as viewed in the thickness direction, and the respective portions decrease in size in an order of the first wiring portion, the second wiring portion and the third wiring portion.

15. The electronic component according to claim 1, wherein the side-surface covering portion further covers the second side surface, and have a step as proceeding from the first side surface to the second side surface.

16. The electronic component according to claim 1, wherein the external electrode is formed with a dimple.

* * * * *